US012056302B2

(12) United States Patent
Kim et al.

(10) Patent No.: US 12,056,302 B2
(45) Date of Patent: Aug. 6, 2024

(54) INPUT SENSING UNIT AND ELECTRONIC DEVICE INCLUDING THE SAME

(71) Applicant: Samsung Display Co., Ltd., Yongin-si (KR)

(72) Inventors: Jinkyu Kim, Cheongju-si (KR); Yeon-Mun Jeon, Cheonan-si (KR); Byoung-Chan Kwak, Cheonan-si (KR); Jooil Kim, Gumi-si (KR); Sangmin Baek, Asan-si (KR); Jungchul Woo, Cheonan-si (KR); Kwangrae Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/119,845

(22) Filed: Mar. 10, 2023

(65) Prior Publication Data

US 2023/0214040 A1 Jul. 6, 2023

Related U.S. Application Data

(63) Continuation of application No. 17/107,913, filed on Nov. 30, 2020, now Pat. No. 11,604,524.

(30) Foreign Application Priority Data

Feb. 18, 2020 (KR) .......................... 10-2020-0019638

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0446* (2019.05); *H10K 50/844* (2023.02);
(Continued)

(58) Field of Classification Search
CPC ...... H10K 50/86; H10K 50/844; H10K 59/12; H10K 59/131; H10K 59/40;
(Continued)

(56) References Cited

U.S. PATENT DOCUMENTS

| 9,535,522 B2 * | 1/2017 | Ahn ...................... G06F 3/0412 |
| 2015/0293634 A1 * | 10/2015 | Her ....................... G06F 3/0446 |
| | | 345/174 |

(Continued)

FOREIGN PATENT DOCUMENTS

| KR | 10-1572432 | 11/2015 |
| KR | 10-2017-0089467 | 8/2017 |

OTHER PUBLICATIONS

Non-Final Office Action dated Mar. 11, 2022, in U.S. Appl. No. 17/107,913.
(Continued)

*Primary Examiner* — Kwin Xie
(74) *Attorney, Agent, or Firm* — Lewis Roca Rothgerber Christie LLP

(57) ABSTRACT

An electronic device including a display unit including light-emitting areas providing an image and non-light-emitting areas adjacent to the light-emitting areas, and an input sensing unit disposed on the display unit and including: a first insulating layer disposed on the display unit; a first conductive layer disposed on the first insulating layer and including first conductive patterns; a second insulating layer including first contact holes exposing the first conductive patterns and second contact holes exposing the first insulating layer overlapping each other, and disposed on the first insulating layer and covering the first conductive layer; and a second conductive layer formed of mesh lines that cross each other and define mesh openings overlapping the corresponding light-emitting areas, in which each of the first (Continued)

contact holes and the second contact holes overlaps intersection portions of the mesh lines.

15 Claims, 19 Drawing Sheets

(51) Int. Cl.
  *H10K 50/844* (2023.01)
  *H10K 59/12* (2023.01)
  *H10K 59/40* (2023.01)
(52) U.S. Cl.
  CPC ............. *H10K 59/12* (2023.02); *H10K 59/40* (2023.02); *G06F 2203/04112* (2013.01)
(58) Field of Classification Search
  CPC .. G06F 2203/04111; G06F 2203/04112; G06F 3/0443; G06F 3/0446; G06F 3/0412; G06F 1/1643; G06F 1/1626
  USPC .................................................. 345/173–174
  See application file for complete search history.

(56) References Cited

U.S. PATENT DOCUMENTS

| | | |
|---|---|---|
| 2017/0212629 A1 | 7/2017 | Cho et al. |
| 2017/0228071 A1* | 8/2017 | Yoon ...................... G06F 3/0443 |
| 2017/0308212 A1* | 10/2017 | Jin ........................ H10K 59/131 |
| 2017/0353181 A1 | 12/2017 | Kim et al. |
| 2017/0364184 A1 | 12/2017 | Weinerth et al. |
| 2018/0196561 A1* | 7/2018 | Kim ...................... G06F 3/0412 |
| 2019/0064960 A1 | 2/2019 | Na et al. |
| 2019/0095020 A1 | 3/2019 | Wu et al. |
| 2019/0115411 A1* | 4/2019 | Park ........................ H10K 59/40 |
| 2019/0250738 A1* | 8/2019 | Lee ........................ G06F 3/0443 |
| 2019/0319076 A1 | 10/2019 | Lee et al. |
| 2022/0206641 A1* | 6/2022 | Kim ...................... G06F 3/0446 |

OTHER PUBLICATIONS

Final Office Action dated Jun. 22, 2022, in U.S. Appl. No. 17/107,913.
Notice of Allowance dated Nov. 15, 2022, in U.S. Appl. No. 17/107,913.

* cited by examiner

INPUT SENSING UNIT AND ELECTRONIC DEVICE INCLUDING THE SAME

CROSS-REFERENCE TO RELATED APPLICATIONS

This application is a Continuation of U.S. patent application Ser. No. 17/107,913, filed on Nov. 30, 2020, which claims priority from and the benefit of Korean Patent Application No. 10-2020-0019638, filed on Feb. 18, 2020, each of which is hereby incorporated by reference for all purposes as if fully set forth herein.

BACKGROUND

Exemplary embodiments of the invention relate generally to an electronic device and, more specifically, to an electronic device with improved reliability.

An electronic device is activated by an electrical signal. The electronic device includes an input sensing unit, which may sense a variety of inputs provided from the outside. The input sensing unit is used solely or along with a display unit for displaying an image to improve a user's convenience.

The electronic device includes a plurality of sensing patterns, to which electrical signals for activating the electronic device are applied. A region where the sensing patterns are activated may be used to display information or to respond to a touch applied from the outside.

The above information disclosed in this Background section is only for understanding of the background of the inventive concepts, and, therefore, it may contain information that does not constitute prior art.

SUMMARY

Devices constructed according to exemplary embodiments of the invention are capable of improving visibility.

Additional features of the inventive concepts will be set forth in the description which follows, and in part will be apparent from the description, or may be learned by practice of the inventive concepts.

An electronic device according to an exemplary embodiment includes a display unit configured to provide an image, and an input sensing unit disposed on the display unit, the input sensing unit including a sensing insulating layer including a first insulating layer disposed on the display unit, and a second insulating layer disposed on the first insulating layer and including plurality of first contact holes and a plurality of second contact holes, a first sensing electrode including a plurality of first sensing patterns arranged in a first direction and extending in a second direction crossing the first direction, and a plurality of first conductive patterns disposed between the first sensing patterns, and a second sensing electrode including a plurality of second sensing patterns arranged in the second direction and extending in the first direction, and a plurality of second conductive patterns disposed between the second sensing patterns, in which the first sensing patterns and the first conductive patterns are coupled to each other through corresponding ones of the first contact holes, and at least one of the first sensing electrode and the second sensing electrode is in contact with the first insulating layer through the second contact holes.

The first sensing pattern, the second sensing pattern, and the second conductive pattern may include mesh lines defining a plurality of mesh openings, and the mesh lines may be disposed on the second insulating layer.

The second contact holes may overlap the mesh lines.

The display unit may include a circuit device layer including a plurality of transistors, a display device layer including a pixel definition layer including a plurality of display openings, first electrodes respectively exposed by the openings, a second electrode opposite to the first electrodes, and emission layers disposed between the first electrodes and the second electrode, and an encapsulation layer including a first thin inorganic layer covering the display device layer, a thin organic layer disposed on the first thin inorganic layer, and a second thin inorganic layer disposed on the thin organic layer, and each of the emission layers may overlap a corresponding one of the mesh openings.

The first insulating layer may be directly disposed on the second thin inorganic layer.

The input sensing unit may further include a reflection compensation pattern spaced apart from the first sensing electrode and the second sensing electrode, disposed on one of the first insulating layer and the second insulating layer, and disposed at an intersection of the mesh lines, and a length of a short side of the reflection compensation pattern in a third direction is equal to a width of the mesh line that overlaps the reflection compensation pattern.

A length of a long side of the reflection compensation pattern in a direction crossing the third direction may be less than 50% of a width of one of the mesh openings.

The reflection compensation pattern may have an 'X' shape.

The electronic device may include an active region configured to provide the image from the display unit and to sense an external input from the input sensing unit, and a peripheral region adjacent to the active region, and the second contact holes may overlap the active region.

The number of the second contact holes may be greater than the number of the first contact holes.

Each of the first contact holes may include two or more connection contact holes.

Each of the second contact holes may include sub-contact holes having the same shape as the connection contact holes.

The input sensing unit may further include ground patterns respectively enclosed by the second sensing patterns and are spaced apart from the second sensing patterns, and a ground conductive pattern disposed between the ground patterns.

The input sensing unit may further include floating patterns respectively enclosed by the first sensing patterns and are spaced apart from the first sensing patterns.

An input sensing unit according to another exemplary embodiment includes a first insulating layer, first conductive patterns disposed on the first insulating layer, a second insulating layer disposed on the first insulating layer to cover the first conductive patterns, and including first contact holes and second contact holes spaced apart from the first contact holes, and second conductive patterns disposed on the second insulating layer, in which some of the second conductive patterns are connected to the first conductive patterns through the first contact holes, and remaining ones of the second conductive patterns are in contact with the first insulating layer through the second contact holes.

The second conductive patterns may include mesh lines defining a plurality of mesh openings, and the second contact holes may overlap the mesh lines.

The input sensing unit may further include a reflection compensation pattern spaced apart from the second conductive patterns, disposed on one of the first insulating layer and the second insulating layer, and disposed at an intersection of the mesh lines, and a length of a short side of the reflection compensation pattern in a first direction may be equal to a width of the mesh line that overlaps the reflection compensation pattern.

A length of a long side of the reflection compensation pattern in a direction crossing the first direction may be less than half of a width of one of the mesh openings.

The reflection compensation pattern may have an 'X' shape.

The number of the second contact holes may be greater than the number of the first contact holes.

Each of the first contact holes may include two or more connection contact holes.

Each of the second contact holes may have sub-contact holes that have the same shape as the connection contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
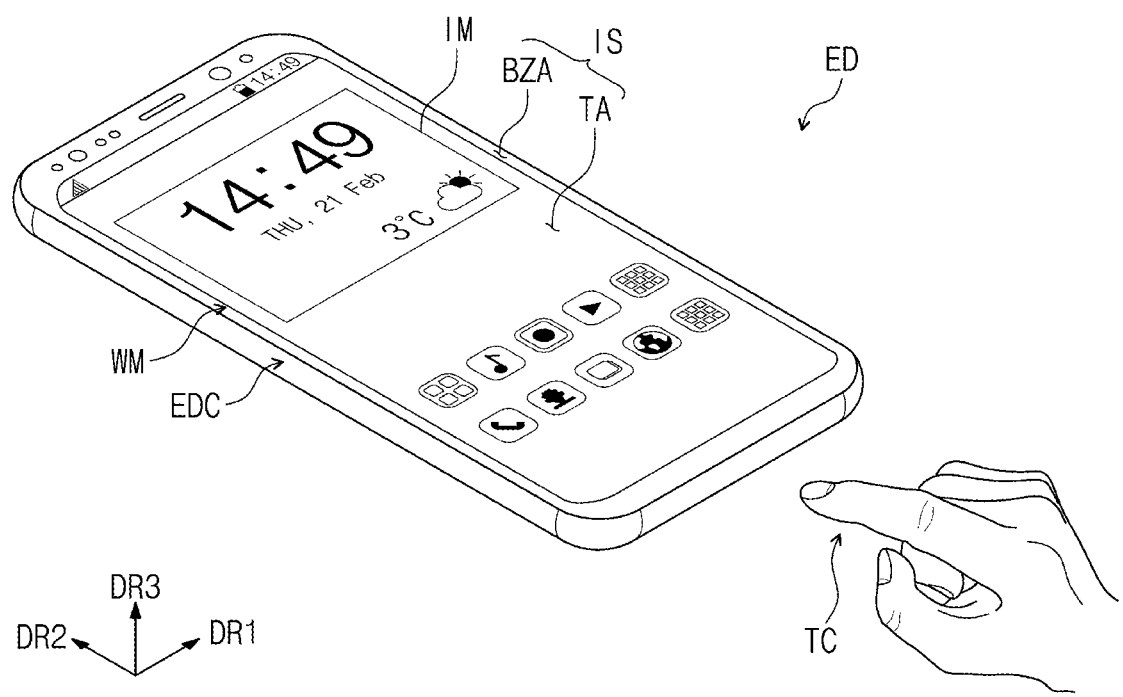
FIG. 1A is a perspective view illustrating an electronic device according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
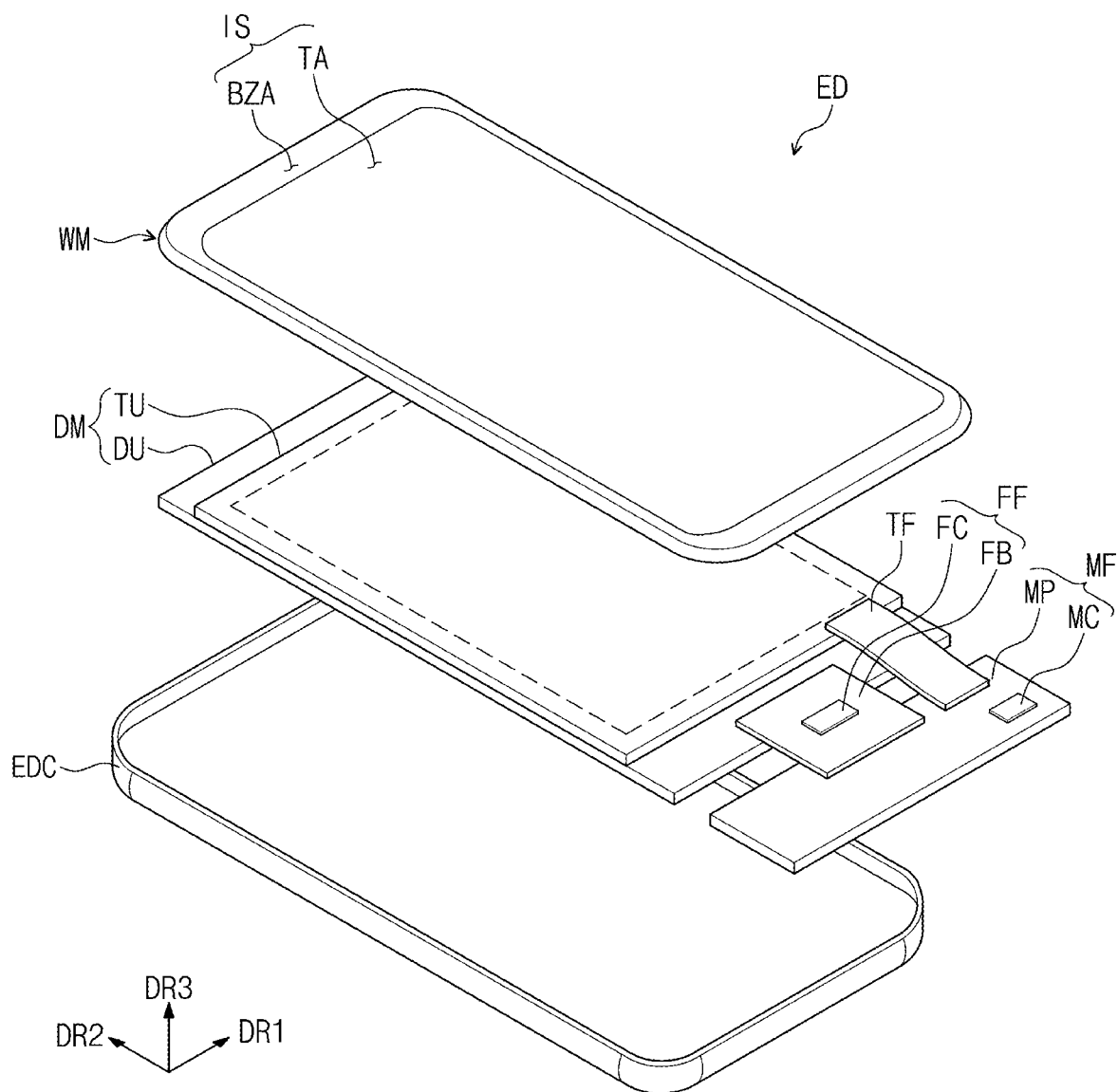
FIG. 1B is an exploded perspective view illustrating an electronic device according to an exemplary embodiment of the invention.
Figure 2A:
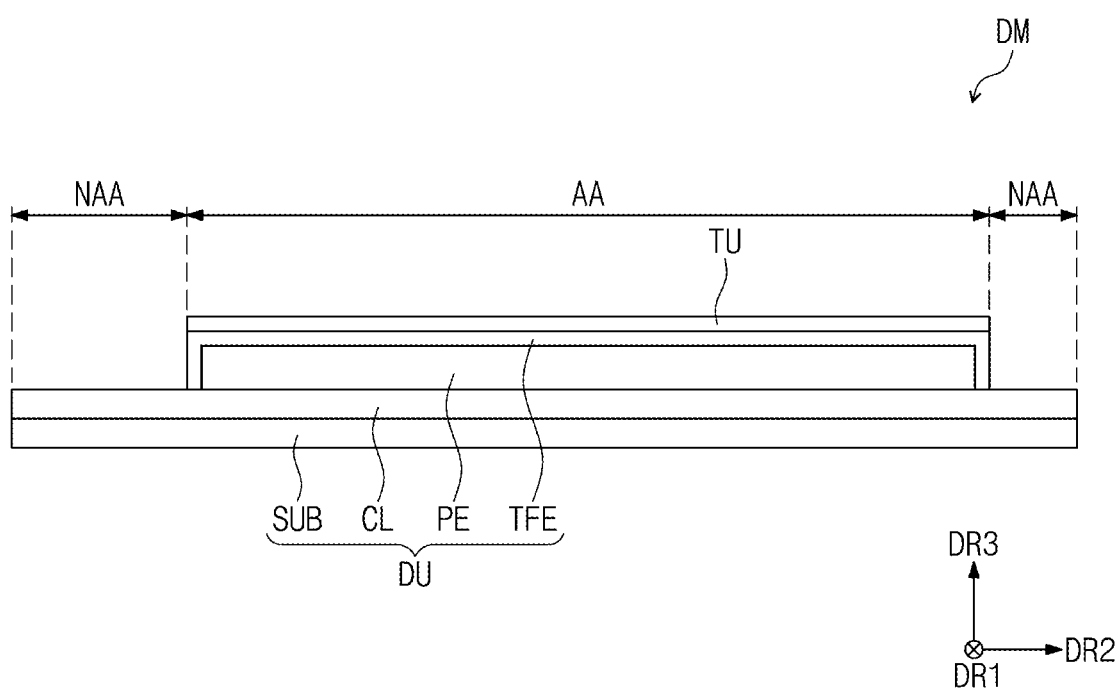
FIG. 2A is a cross-sectional view illustrating a display module according to an exemplary embodiment of the invention.
Figure 2B:
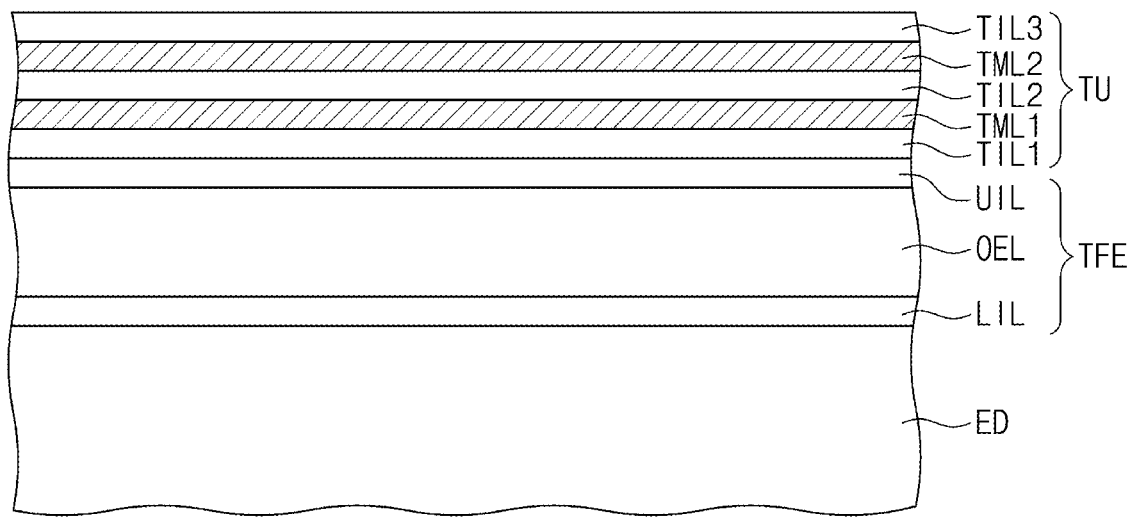
FIG. 2B is an enlarged view of a region of a display module shown in FIG. 2A.
Figure 2B:
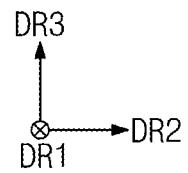
Figure 3:
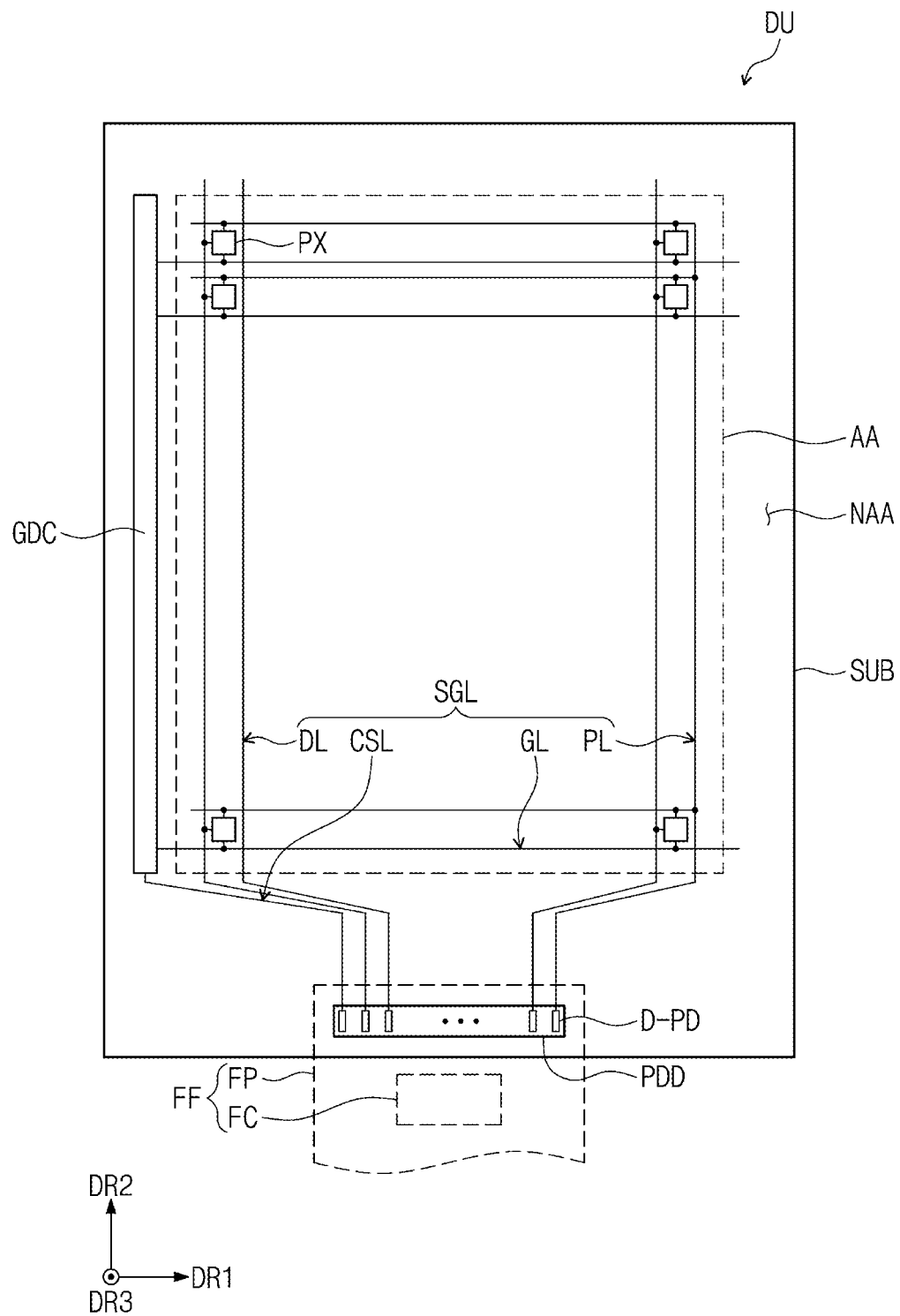
FIG. 3 is a plan view illustrating a display unit according to an exemplary embodiment of the invention.
Figure 4A:
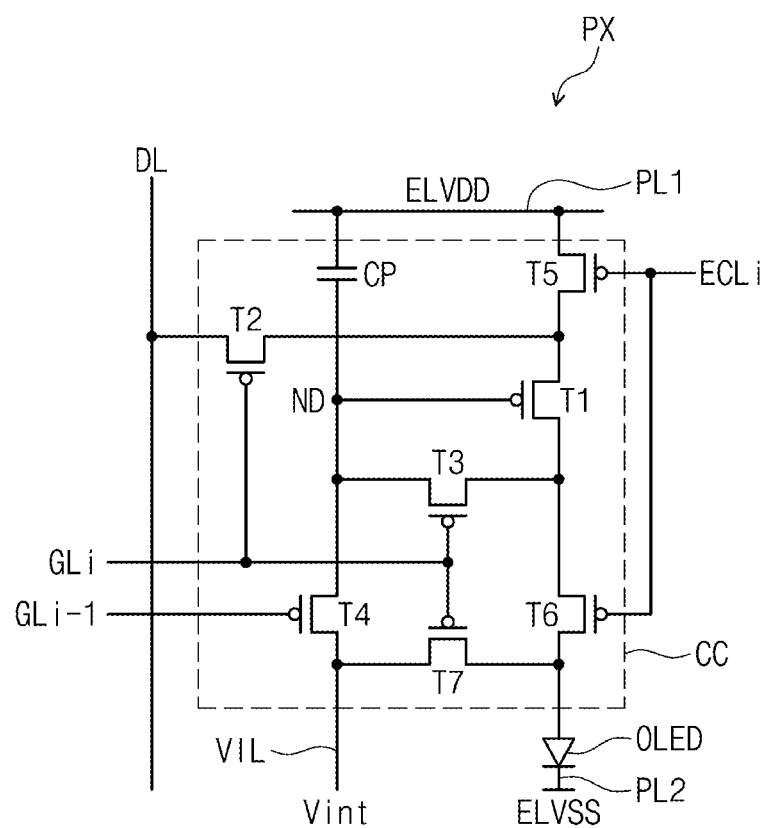
FIG. 4A is an equivalent circuit diagram illustrating a pixel according to an exemplary embodiment of the invention.
Figure 4B:
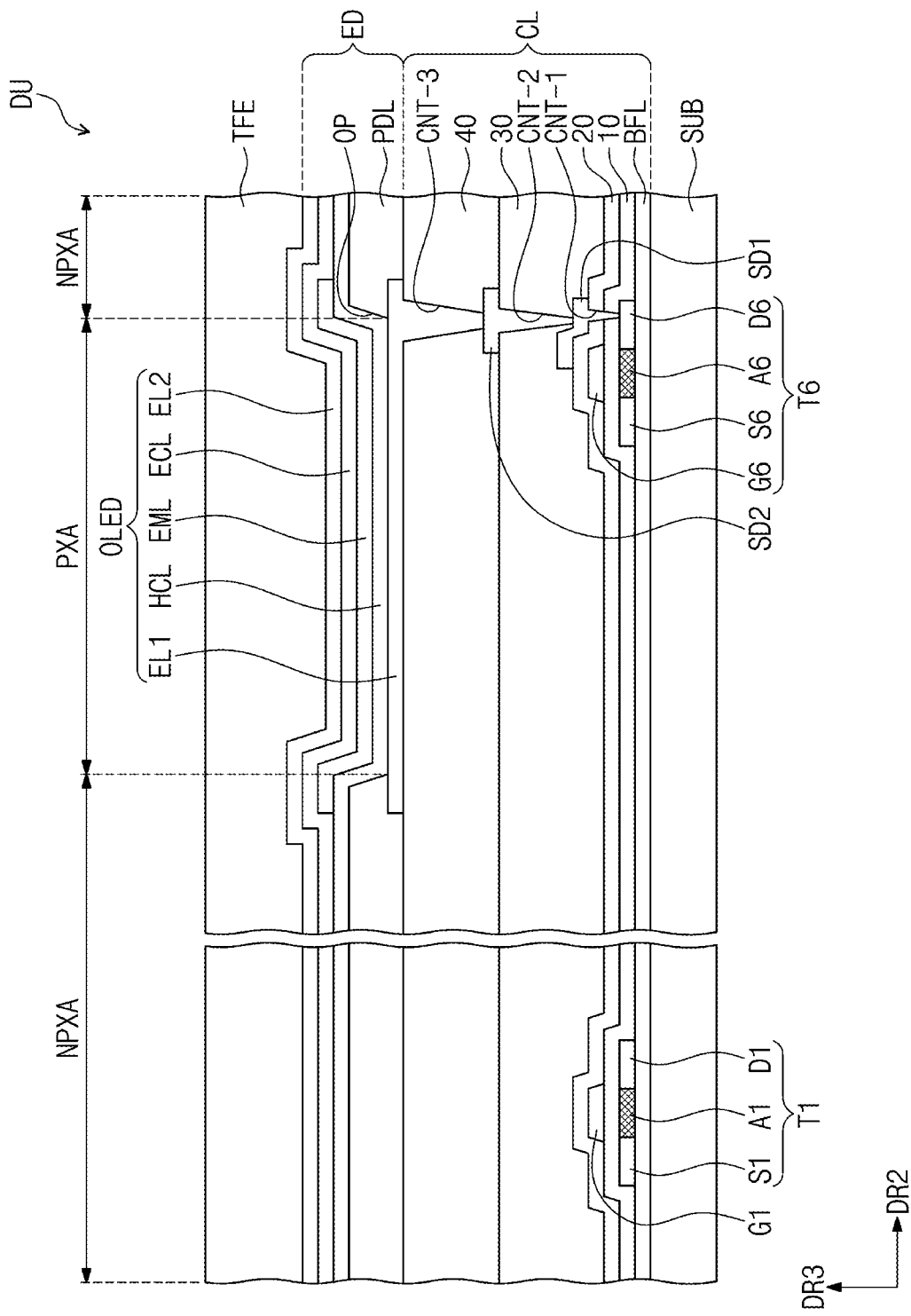
FIG. 4B is a cross-sectional view illustrating a pixel according to an exemplary embodiment of the invention.
Figure 5A:
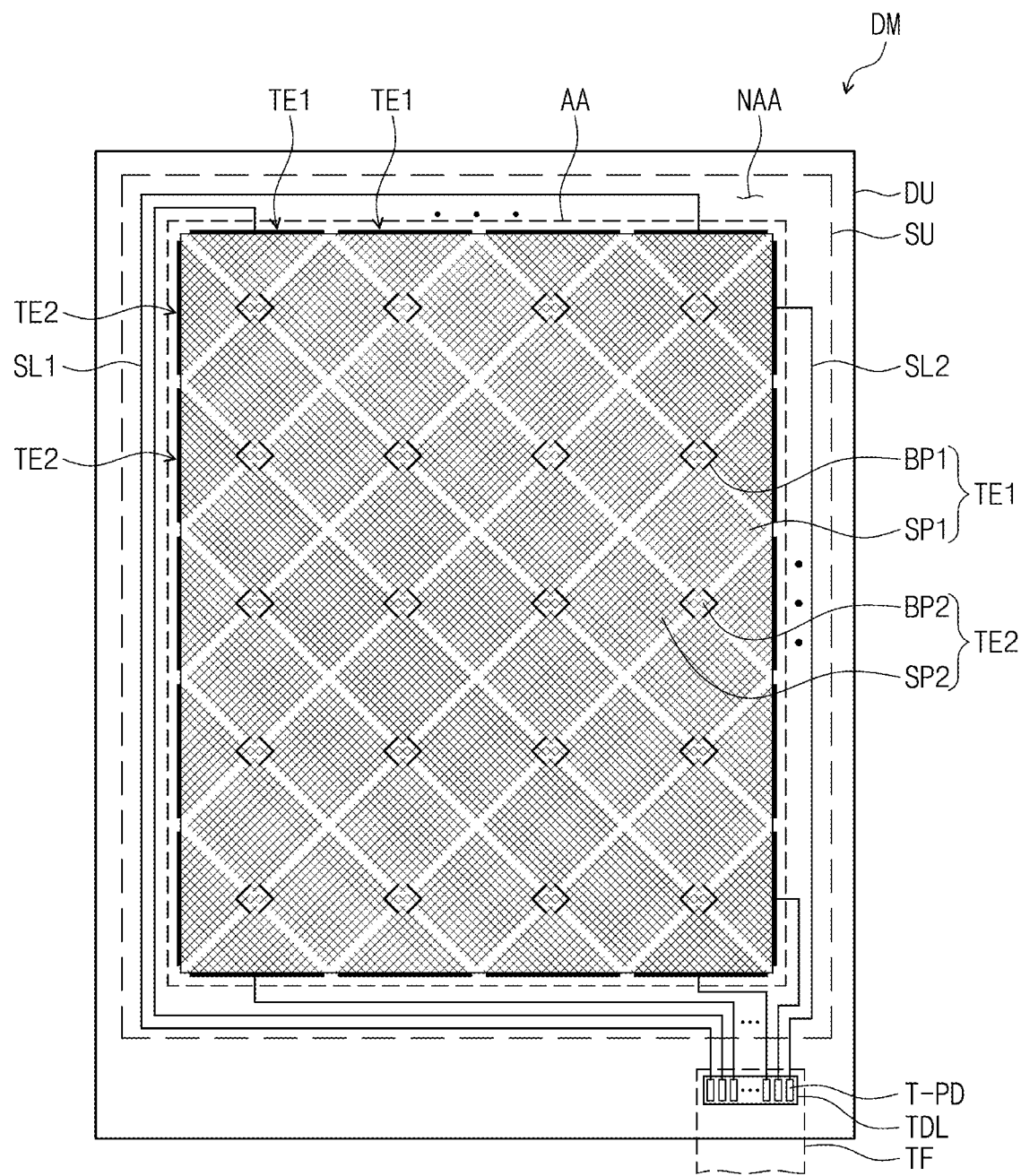
FIG. 5A is a plan view illustrating an input sensing unit according to an exemplary embodiment of the invention.
Figure 5B:
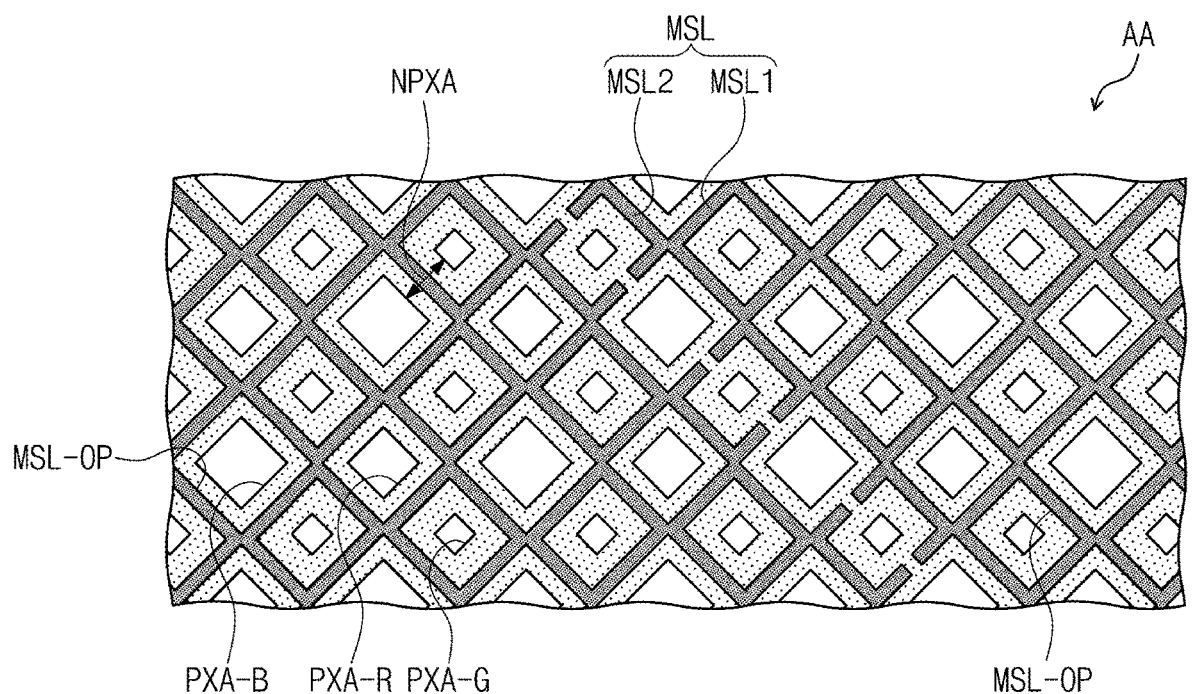
FIG. 5B is an enlarged view illustrating a region of an input sensing unit according to an exemplary embodiment of the invention.
Figure 5B:
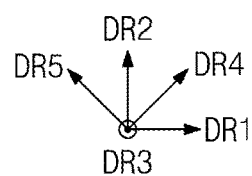

FIG. 1A is a perspective view illustrating an electronic device according to an exemplary embodiment. FIG. 1B is an exploded perspective view illustrating an electronic device according to an exemplary embodiment. FIG. 2A is a cross-sectional view illustrating a display module according to an exemplary embodiment. FIG. 2B is an enlarged view of a region of a display module shown in FIG. 2A. FIG. 3 is a plan view illustrating a display unit according to an exemplary embodiment. FIG. 4A is an equivalent circuit diagram illustrating a pixel according to an exemplary embodiment. FIG. 4B is a cross-sectional view illustrating a pixel according to an exemplary embodiment. FIG. 5A is a plan view illustrating an input sensing unit according to an exemplary embodiment. FIG. 5B is an enlarged view illustrating a region of an input sensing unit according to an exemplary embodiment.

Referring to FIGS. 1A and 1B, an electronic device ED may be selectively activated by an electrical signal applied thereto. The electronic device ED may be provided in various forms. For example, the electronic device ED may be one of tablets, notebooks, computers, smart televisions, and so forth. In FIG. 1A, the electronic device ED is exemplarily illustrated as a smart phone.

The electronic device ED may display an image IM on a display surface IS, which is parallel to a first direction DR1 and a second direction DR2, and is normal to a third direction DR3. The display surface IS, on which the image IM is displayed, may correspond to a front surface of the electronic device ED. The image IM may be a video image or a still image. FIG. 1A exemplarily illustrates an internet search window as the image IM.

In the illustrated exemplary embodiment, a front or top surface and a rear or bottom surface of each element may be distinguished from each other with reference to the third direction DR3 or a display direction of the image IM. The front surface and the rear surface may be opposite to each other in the third direction DR3, and a direction normal to each of the front and rear surfaces may be parallel to the third direction DR3.

A distance between the front and rear surfaces in the third direction DR3 may correspond to a thickness or height of the electronic device ED in the third direction DR3. Meanwhile, directions indicated by the first to third directions DR1, DR2, and DR3 may be relative concept, and in some exemplary embodiments, they may be changed to indicate other directions. Hereinafter, first to third directions may be directions indicated by the first to third directions DR1, DR2, and DR3, respectively, and will be referenced with the same reference numerals.

The front surface of the electronic device ED may be divided into a transmission region TA and a bezel region BZA. The transmission region TA may be a region, on which the image IM is displayed. The image IM may be provided to a user through the transmission region TA. In the illustrated exemplary embodiment, the transmission region TA is illustrated as having a rectangular shape with rounded corners. However, the inventive concepts are not limited thereto, and in other exemplary embodiments, the shape of the transmission region TA may be variously changed.

The bezel region BZA may be adjacent to the transmission region TA. The bezel region BZA may have a predetermined color. The bezel region BZA may be provided to enclose the transmission region TA. As such, the shape of the transmission region TA may be substantially defined by the bezel region BZA. However, the inventive concepts are not limited thereto, and in some exemplary embodiments, the bezel region BZA may be provided near one of sides of the transmission region TA or may be omitted. The inventive concepts are not limited to a specific structure of the electronic device, and the electronic device may be provided in various forms.

The electronic device ED may sense an external input TC provided from the outside. The external input TC may include various types of input signals, which are provided from the outside of the electronic device ED. For example, the external input TC may be a touching-type input by a user's body or hand, and a non-touching-type input such as a reduction in distance to the electronic device ED or a hovering event near the electronic device ED. In addition, the external input TC may include a change in physical characteristics (e.g., force, pressure, or light intensity) of an external input, without being limited thereto. In FIG. 1A, a user's hand is exemplarily illustrated as the external input TC.

The electronic device ED may include a window member WM, an external case EDC, a display module DM, a main circuit substrate MF, and flexible circuit substrates FF and TF. The display module DM may include a display unit DU and an input sensing unit TU.

The window member WM may be disposed on the display module DM. The window member WM may protect the display module DM from an external impact or a contamination material.

The window member WM may be formed of a transparent material, and thus, an image may be emitted to the outside through the window member WM. For example, the window member WM may be formed of glass, sapphire, plastic, or the like. The window member WM is exemplarily illustrated as having a single layer, but in some exemplary embodiments, the window member WM may include a plurality of layers. In an exemplary embodiment, the bezel region BZA of the electronic device ED may be formed as a region of the window member WM, on which a material of a specific color is printed.

The external case EDC may receive the display module DM. The external case EDC may be coupled with the window member WM to define an outer appearance of the electronic device ED. The external case EDC may absorb impact exerted from the outside and may prevent a contamination material or moisture from entering the display module DM. In this manner, internal elements of the external case EDC may be protected from the contamination material or the moisture. In an exemplary embodiment, the external case EDC may include a plurality of container members coupled to each other.

Referring to FIGS. 2A and 2B, the display module DM may include the display unit DU and the input sensing unit TU disposed on the display unit DU. The display module DM may display an image in response to an electrical signal applied thereto, and may transmit or receive information on the external input TC.

The display module DM may include an active region AA and a non-active or peripheral region NAA. The active region AA may be defined as a region through which an image provided from the display module DM is emitted, and the non-active region NAA may be a region enclosing the active region AA. However, the inventive concepts are not limited thereto, and in some exemplary embodiments, the shape of the non-active region NAA may be variously changed. The active region AA of the display module DM may correspond to the transmission region TA.

The display unit DU may include a base substrate SUB, a circuit device layer CL, a display device layer PE, and an encapsulation layer TFE.

The base substrate SUB may be a flexible or rigid substrate. The base substrate SUB may be a base layer on which elements included in the circuit device layer CL are disposed.

The circuit device layer CL may be disposed on the base substrate SUB. The circuit device layer CL may further include signal lines, a control circuit, and a plurality of transistors including a semiconductor layer. The display device layer PE may include an organic light emitting device OLED (e.g., see FIG. 4B) and a pixel definition layer. The encapsulation layer TFE may be provided to hermetically seal the display device layer PE. In an exemplary embodiment, the encapsulation layer TFE may include at least one organic layer and at least one inorganic layer.

In an exemplary embodiment, the input sensing unit TU may be directly disposed on the display unit DU. As used herein, the expression "an element B1 may be directly disposed on an element A1" may refer that an adhesive member is not disposed between the elements A1 and B1. After the formation of the element A1, the element B1 may be formed on a base surface, which is provided by the element A1, through a successive process.

As shown in FIG. 2B, the encapsulation layer TFE may include a first encapsulation inorganic layer LIL, an organic layer OEL, and a second encapsulation inorganic layer UIL.

The first encapsulation inorganic layer LIL may cover the display device layer PE. The first encapsulation inorganic layer LIL may prevent external moisture or oxygen from entering the organic light emitting device OLED. For example, the first encapsulation inorganic layer LIL may be formed of or include at least one of silicon nitride, silicon oxide, or compounds thereof. The first encapsulation inorganic layer LIL may be formed by a chemical vapor deposition process.

The organic layer OEL may be disposed on the first encapsulation inorganic layer LIL and may be in contact with the first encapsulation inorganic layer LIL. The organic layer OEL, which is disposed on the first encapsulation inorganic layer LIL, may have a flat top surface. The organic layer OEL may cover an uneven top surface of the first encapsulation inorganic layer LIL or particles on the first encapsulation inorganic layer LIL, so as to prevent the uneven surface profile of the first inorganic encapsulation layer IOL1 or the particles from affecting elements or layers to be formed on the organic layer OEL. In addition, the organic layer OEL may relieve a stress between layers that are in contact with each other. In an exemplary embodiment, the organic layer OEL may be formed of or include an organic material, and may be formed by a solution process (e.g., spin coating, slit coating, and inkjet processes).

The second encapsulation inorganic layer UIL may be disposed on the organic layer OEL to cover the organic layer OEL. Since the organic layer OEL has a relatively flat top surface, the second encapsulation inorganic layer UIL may be formed more stably, as compared to the case when the second encapsulation inorganic layer UIL is formed on the first encapsulation inorganic layer LIL. The second encapsulation inorganic layer UIL may encapsulate the organic layer OEL and may prevent moisture from being leaked from the organic layer OEL to the outside. The second encapsulation inorganic layer UIL may be formed of or include at least one of silicon nitride, silicon oxide, or compounds thereof. The second encapsulation inorganic layer UIL may be formed by a chemical vapor deposition process.

The input sensing unit TU may be disposed on the encapsulation layer TFE. The input sensing unit TU may be directly disposed on the encapsulation layer TFE through a successive process. The input sensing unit TU may sense an external input in a self- or mutual-capacitance manner. Conductive patterns, which are included in the input sensing unit TU, may be disposed and connected to each other in various manners, depending on the sensing manner of the input sensing unit TU.

The input sensing unit TU may include a sensing insulating layer and at least one conductive layer (e.g., TML1 and TML2). The sensing insulating layer may include a first insulating layer TIL1, a second insulating layer TIL2, and a third insulating layer TIL3, each of which is formed of or includes at least one of inorganic or organic materials.

In an exemplary embodiment, the first insulating layer TIL1 may be directly disposed on the second encapsulation inorganic layer UIL of the encapsulation layer TFE. A first conductive layer TML1 may be disposed on the first insulating layer TIL1. The second insulating layer TIL2 may be disposed on the first insulating layer TIL1 to cover the first conductive layer TML1. A second conductive layer TML2 may be disposed on the second insulating layer TIL2. The third insulating layer TIL3 may be disposed on the second insulating layer TIL2 to cover the second conductive layer TML2.

In an exemplary embodiment, each of the conductive layers TML1 and TML2 may have a single-layered structure, and may be formed of or include at least one of metallic materials or transparent conductive materials. The metallic materials may include, for example, molybdenum, silver, titanium, copper, aluminum, or an alloy thereof. The transparent conductive materials may include transparent conductive oxide, such as indium tin oxide (ITO), indium zinc oxide (IZO), zinc oxide (ZnO), or indium tin zinc oxide (ITZO). In some exemplary embodiments, the transparent conductive material may include a conductive polymer (e.g., PEDOT), metal nanowires, or graphene. In an exemplary embodiment, each of the conductive layers TML1 and TML2 may include a multi-layered structure of metal layers. For example, the multi-layered structure of the metal layers may be a triple-layered structure including, for example, titanium/aluminum/titanium layers. The conductive layer TML1 or TML2 of the multi-layered structure may include at least one metal layer and at least one transparent conductive layer.

Referring to FIG. 3, the display unit DU may include a driving circuit GDC, a plurality of signal lines SGL, and a plurality of pixels PX. The display unit DU may include a pixel pad portion PDD provided in the non-active region NAA. The pixel pad portion PDD may include pixel pads D-PD, each of which is connected to a corresponding one of the signal lines SGL. In FIG. 3, a first flexible circuit substrate FF coupled to the pixel pad portion PDD is exemplarily illustrated with a dotted line.

In an exemplary embodiment, a plurality of the pixels PX may be provided in the active region AA. Each of the pixels PX may include the organic light emitting device OLED and a pixel driving circuit connected thereto. The driving circuit GDC, the signal lines SGL, the pixel pad portion PDD, and the pixel driving circuit may be included in the circuit device layer CL shown in FIG. 2A.

The driving circuit GDC may include a gate driving circuit. The gate driving circuit may generate a plurality of gate signals and sequentially output the gate signals to a plurality of gate lines GL to be described below. The gate driving circuit may also be configured to output other control signals to the pixel driving circuit.

The gate driving circuit may include a plurality of transistors, which may be formed by the same method as that for the driving circuit of the pixels PX, or by a low-temperature polycrystalline silicon (LTPS) or low-temperature polycrystalline oxide (LTPO) process, for example.

The signal lines SGL may include gate lines GL, data lines DL, a power line PL, and a control signal line CSL. Each of the gate lines GL may be connected to corresponding ones of the pixels PX, and each of the data lines DL may be connected to corresponding ones of the pixels PX. The power line PL may be connected to the pixels PX. The control signal line CSL may be used to provide control signals to the gate driving circuit.

The pixel pad portion PDD may be a portion to which the first flexible circuit substrate FF is coupled, and the pixel pads D-PD of the pixel pad portion PDD may be connected to pads included in the first flexible circuit substrate FF. Accordingly, the display unit DU and the main circuit substrate MF may be connected to each other through the first flexible circuit substrate FF.

The pixel pads D-PD may be portions of interconnection lines (e.g., SGL) disposed in the circuit device layer CL, and are exposed from an insulating layer of the circuit device layer CL.

The pixel pads D-PD may be connected to corresponding ones of the pixels PX through the signal lines SGL. In addition, the driving circuit GDC may be connected to one of the pixel pads D-PD.

The pixel PX may be electrically connected to a plurality of signal lines. FIG. 4A exemplarily illustrates some of the signal lines (e.g., the gate lines GLi and GLi-1, the data line DL, a first power line PL1, a second power line PL2, an initialization power line VIL, and an emission control line ECLi). However, the inventive concepts are not limited thereto, and in some exemplary embodiments, the pixel PX may be additionally connected to other signal lines or some of the illustrated signal lines may be omitted.

The pixel PX may include the organic light emitting device OLED and a pixel circuit CC. The pixel circuit CC may include a plurality of transistors T1-T7 and a capacitor CP. The pixel circuit CC may control an amount of current flowing through the organic light emitting device OLED, in response to data signals.

The organic light emitting device OLED may emit light, and the brightness of light emitted may be determined by an amount of current supplied from the pixel circuit CC. As such, a first power ELVDD may be set to a level higher than that of a second power ELVSS.

Each of the transistors T1-T7 may include an input or source electrode, an output or drain electrode, and a control or gate electrode. As used herein, one of the input and output electrodes may be referred to as "a first electrode", and the other may be referred to as "a second electrode".

The first electrode of the first transistor T1 may be connected to the first power line PL1 through the fifth transistor T5. The first power line PL1 may be a line to which the first power ELVDD is provided. The second electrode of the first transistor T1 may be coupled to the anode of the organic light emitting device OLED through the sixth transistor T6. Hereinafter, the first transistor T1 may be referred to as a driving transistor.

The first transistor T1 may control an amount of current flowing through the organic light emitting device OLED in response to a voltage applied to the control electrode of the first transistor T1.

The second transistor T2 may be provided between and coupled to the data line DL and the first electrode of the first transistor T1. The control electrode of the second transistor T2 may be coupled to an $i^{th}$ gate line GLi. When an $i^{th}$ scan signal is applied to the $i^{th}$ gate line GLi, the second transistor T2 may be turned on, and in this case, the data line DL may be electrically coupled to the first electrode of the first transistor T1.

The third transistor T3 may be provided between and coupled to the second electrode of the first transistor T1 and the control electrode of the first transistor T1. The control electrode of the third transistor T3 may be coupled to the $i^{th}$ gate line GLi. When the $i^{th}$ scan signal is applied to the $i^{th}$ gate line GLi, the third transistor T3 may be turned on, and in this case, the second electrode of the first transistor T1 may be electrically coupled to the control electrode of the first transistor T1. As such, when the third transistor T3 is turned on, the first transistor T1 may function as a diode.

The fourth transistor T4 may be provided between and coupled to a node ND and the initialization power line VIL. The control electrode of the fourth transistor T4 may be coupled to an $(i-1)^{th}$ gate line GLi-1. The node ND may be a node to which the fourth transistor T4 and the control electrode of the first transistor T1 are coupled. When an $(i-1)^{th}$ scan signal is applied to the $(i-1)^{th}$ gate line GLi-1, the fourth transistor T4 may be turned on, and in this case, an initialization voltage Vint may be provided to the node ND.

The fifth transistor T5 may be provided between and coupled to the first power line PL1 and the first electrode of the first transistor T1. The sixth transistor T6 may be provided between and coupled to the second electrode of the first transistor T1 and the anode of the organic light emitting device OLED. The control electrode of the fifth transistor T5 and the control electrode of the sixth transistor T6 may be coupled to the $i^{th}$ emission control line ECLi.

The seventh transistor T7 may be provided between and coupled to the initialization power line VIL and the anode of the organic light emitting device OLED. The control electrode of the seventh transistor T7 may be coupled to the $i^{th}$ gate line GLi. When the $i^{th}$ scan signal is applied to the $i^{th}$ gate line GLi, the seventh transistor T7 may be turned on, and in this case, the initialization voltage Vint may be provided to the anode of the organic light emitting device OLED.

The seventh transistor T7 may improve a black representation ability of the pixel PX. In particular, if the seventh transistor T7 is turned on, a parasitic capacitor of the organic light emitting device OLED may be discharged. In this case, when it is necessary to represent black, it may be possible to prevent light from being emitted from the organic light emitting device OLED by a leakage current from the first transistor T1. In this manner, the black representation ability of the pixel PX may be improved.

In addition, although FIG. 4A exemplarily illustrates that the control electrode of the seventh transistor T7 is coupled to the $i^{th}$ gate line GLi, the inventive concepts are not limited thereto. In certain exemplary embodiments, the control electrode of the seventh transistor T7 may be coupled to the $(i-1)^{th}$ gate line GLi-1 or an $(i+1)^{th}$ gate line.

FIG. 4A exemplarily illustrates that the pixel circuit CC includes PMOS transistors, but the inventive concepts are not limited thereto. For example, the pixel circuit CC may include NMOS transistors. Alternatively, the pixel circuit CC may include NMOS and PMOS transistors.

The capacitor CP may be disposed between the first power line PL1 and the node ND. The capacitor CP may be charged to a voltage level corresponding to the data signal. When the fifth and sixth transistors T5 and T6 are turned on, an amount of current flowing through the first transistor T1 may be determined depending on a voltage level of the capacitor CP.

The organic light emitting device OLED may be electrically connected to the sixth transistor T6 and the second power line PL2. The organic light emitting device OLED may receive the second power ELVSS through the second power line PL2. The organic light emitting device OLED may include an emission layer.

The organic light emitting device OLED may emit light, and the intensity of light may be determined by a difference in voltage level between a signal transmitted through the sixth transistor T6 and the second power ELVSS received through the second power line PL2.

In other exemplary embodiments, the structure of the pixel PX is not limited to the structure shown in FIG. 4A. For example, the structure of the pixel PX may be variously changed to control the light emitting operation of the organic light emitting device OLED.

Referring to FIG. 4B, the display unit DU may include a plurality of insulating layers, a semiconductor pattern, a conductive pattern, a signal line, and so forth. An insulating layer, a semiconductor layer, and a conductive layer may be formed by a coating or deposition process. Thereafter, the insulating layer, the semiconductor layer, and the conductive layer may be selectively patterned using a photolithography process. This method may be used to form semiconductor patterns, conductive patterns, and signal lines constituting the circuit device layer CL and the display device layer PE.

The base substrate SUB may include a synthetic resin film. The synthetic resin layer may include a thermosetting resin. The base substrate SUB may have a multi-layered structure. For example, the base substrate SUB may have a triple-layered structure including a synthetic resin layer, an adhesive layer, and a synthetic resin layer. The synthetic resin layer may be a polyimide-based resin layer, and the material for the synthetic resin layer is not limited to a specific material. The synthetic resin layer may include at least one of acryl resins, methacryl resins, polyisoprene resins, vinyl resins, epoxy resins, urethane resins, cellulose resins, siloxane resins, polyamide resins, or perylene resins. In an exemplary embodiment, the base substrate SUB may include a glass substrate, a metal substrate, or a substrate formed of an organic/inorganic composite material.

At least one inorganic layer may be disposed on the top surface of the base substrate SUB. The inorganic layer may be formed of or include at least one of aluminum oxide, titanium oxide, silicon oxide silicon oxynitride, zirconium oxide, and hafnium oxide. The inorganic layer may have a multi-layered structure. The multi-layered inorganic layers may be used as a barrier layer and/or a buffer layer.

The display unit DU may include a buffer layer BFL. The buffer layer BFL may enhance an adhesive strength between the base substrate SUB and the semiconductor pattern of the transistor. The base substrate SUB may include at least one of a silicon oxide layer and a silicon nitride layer. The silicon oxide layer and the silicon nitride layer may be alternatingly stacked.

A semiconductor pattern may be disposed on the buffer layer BFL. The semiconductor pattern may be formed of or include polysilicon. However, the inventive concepts are not limited thereto, and in some exemplary embodiments, the semiconductor pattern may be formed of or include at least one of amorphous silicon or metal oxides.

FIG. 4B illustrates a portion of the semiconductor pattern, and the semiconductor pattern may further include another portion that is disposed on other region of the pixel PX, when viewed in a plan view. In an exemplary embodiment, the semiconductor patterns may be arranged throughout the pixels PX according to a predetermined layout. Electrical characteristics of the semiconductor pattern may be changed depending on its doping state. The semiconductor pattern may include a doped region and an undoped region. The doped region may be doped with n-type dopants or p-type dopants. A p-type transistor may include an impurity region doped with p-type dopants.

The doped region may have conductivity higher than the undoped region, and may be used as an electrode or a signal line. The undoped region may substantially correspond to an active or channel region of a transistor. In particular, a portion of the semiconductor pattern may be used as the active region of the transistor, another portion may be used as the source or drain electrode of the transistor, and other region may be used as an additional electrode or a signal line.

As shown in FIG. 4B, the first transistor T1 may include a source S1, an active A1, and a drain D1, each of which is a part of the semiconductor pattern, and the sixth transistor T6 may include a source S6, an active A6, and a drain D6, each of which is a part of the semiconductor pattern. The sources S1 and S6 and the drains D1 and D6 may be extended from the actives A1 and A6 in opposite directions, when viewed in a cross-sectional view.

A first intermediate insulating layer 10 may be disposed on the buffer layer BFL. The first intermediate insulating layer 10 may be overlapped with each of the pixels and may cover the semiconductor pattern. The first intermediate insulating layer 10 may be an inorganic and/or organic layer and may have a single- or multi-layered structure. The first intermediate insulating layer 10 may be formed of or include at least one of aluminum oxide, titanium oxide, silicon oxide, silicon oxynitride, zirconium oxide, and hafnium oxide. In the illustrated exemplary embodiment, the first intermediate insulating layer 10 may be a single-layered silicon oxide layer. The first intermediate insulating layer 10 as well as an insulating layer of the circuit device layer CL to be described below may be an inorganic layer and/or an organic layer, and may have a single- or multi-layered structure. The inorganic layer may be formed of or include at least one of the above materials.

Gates G1 and G6 may be disposed on the first intermediate insulating layer 10. The gate G1 may be a portion of a metal pattern. The gates G1 and G6 may be overlapped with the actives A1 and A6. The gates G1 and G6 may be used as a mask in a process of doping the semiconductor pattern.

A second intermediate insulating layer 20 may be disposed on the first intermediate insulating layer 10 to cover the gates G1 and G6. The second intermediate insulating layer 20 may be commonly overlapped with the pixels. The second intermediate insulating layer 20 may be an inorganic and/or organic layer, and may have a single- or multi-layered structure. In the illustrated exemplary embodiment, the second intermediate insulating layer 20 may be a single-layered silicon oxide layer.

A first additional electrode SD1 may be disposed on the second intermediate insulating layer 20. The first additional electrode SD1 may be connected to the drain D6 through a contact hole CNT-1 penetrating the first and second intermediate insulating layers 10 and 20.

A first insulating layer 30 may be disposed on the second intermediate insulating layer 20. The first insulating layer 30 may be an organic layer. A second additional electrode SD2 may be disposed on the first insulating layer 30. The second additional electrode SD2 may be coupled to the first additional electrode SD1 through a contact hole CNT-2 penetrating the first insulating layer 30.

A second insulating layer 40 may be formed on the first insulating layer 30 to cover the second additional electrode SD2. The second insulating layer 40 may be an organic layer. A first electrode EL1 may be disposed on the second insulating layer 40. The first electrode EL1 may be connected to the second additional electrode SD2 through a contact hole CNT-3 penetrating the second insulating layer 40. A display opening OP may be defined in a pixel definition layer PDL. The display opening OP of the pixel definition layer PDL may expose at least a portion of the first electrode EL1.

As shown in FIG. 4B, the active region AA (e.g., see FIG. 2A) of the display unit DU may include a light-emitting region PXA and a non-light-emitting region NPXA adjacent to the light-emitting region PXA. The non-light-emitting region NPXA may enclose the light-emitting region PXA. In the illustrated exemplary embodiment, the light-emitting region PXA may be defined to correspond to a region of the first electrode EL1 exposed by the display opening OP.

A hole control layer HCL may be disposed in common in the light-emitting region PXA and the non-light-emitting region NPXA. The hole control layer HCL may include a hole transport layer. In an exemplary embodiment, the hole control layer HCL may further include a hole injection layer. An emission layer EML may be disposed on the hole control layer HCL. The emission layer EML may be disposed in a region corresponding to the display opening OP. In particular, the light emitting layer EML may include a plurality of isolated patterns, each of which is provided in a corresponding one of the pixels PX.

An electron control layer ECL may be disposed on the emission layer EML. The electron control layer ECL may include an electron transport layer. In an exemplary embodiment, the electron control layer ECL may further include an electron injection layer. The hole control layer HCL and the electron control layer ECL may be formed in common on a plurality of pixels, using an open mask. A second electrode EL2 may be disposed on the electron control layer ECL. In an exemplary embodiment, the second electrode EL2 may be a single pattern, which is disposed in each of the pixels PX.

The encapsulation layer TFE may be disposed on the second electrode EL2. The encapsulation layer TFE may be disposed in common in the plurality of pixels PX. In the illustrated exemplary embodiment, the encapsulation layer TFE may directly cover the second electrode EL2. In an exemplary embodiment, a capping layer covering the second electrode EL2 may be further disposed between the encapsulation layer TFE and the second electrode EL2. In this case, the encapsulation layer TFE may directly cover the capping layer.

The encapsulation layer TFE may be disposed on the organic light emitting device OLED to encapsulate the organic light emitting device OLED. In an exemplary embodiment, a capping layer covering the second electrode EL2 may be further disposed between the second electrode EL2 and the organic light emitting device OLED. The encapsulation layer TFE of FIG. 4B may correspond to the encapsulation layer TFE described with reference to FIG. 2B.

Referring back to FIG. 1B, the main circuit substrate MF may include a base circuit substrate MP and a driving device MC. The base circuit substrate MP may be electrically connected to the display unit DU through a first flexible circuit substrate FF, and the base circuit substrate MP may be electrically connected to the input sensing unit TU through a second flexible circuit substrate TF. The base circuit substrate MP may be provided in the form a flexible printed circuit board (FPCB).

The driving device MC may include a signal control unit (e.g., a timing controller). The signal control unit may receive image signals and then may convert the image signals to image data, which can be used to operate the pixels. In addition, the signal control unit may also receive a variety of control signals (e.g., a vertical synchronization signal, a horizontal synchronization signal, a main clock signal, and a data enable signal), and then may output signals corresponding to the control signals. In an exemplary embodiment, the driving device MC may include a control unit, which is configured to control the input sensing unit TU, but the inventive concepts are not limited thereto.

The first flexible circuit substrate FF may be coupled to a portion of the display unit DU to electrically connect the display unit DU to the main circuit substrate MF. The first flexible circuit substrate FF may include a base film FB and a driving chip FC.

The base film FB may have a flexible property and may include a plurality of circuit lines. As such, the shape of the base film FB may be variously changed depending on the purpose and shape of the display unit DU.

The driving chip FC may be mounted on the base film FB in a chip-on-film (COF) manner. The driving chip FC may include driving devices (e.g., a data driving circuit) to drive pixels. Although FIG. 1B exemplarily shows that the electronic device includes one first flexible circuit substrate FF, however, the inventive concepts are not limited thereto. For example, in some exemplary embodiments, a plurality of the first flexible circuit substrates FF coupled to the display unit DU may be provided.

The second flexible circuit substrate TF may be coupled to a portion of the input sensing unit TU to electrically connect the input sensing unit TU to the main circuit substrate MF. The second flexible circuit substrate TF may be flexible and may include a plurality of circuit lines. The second flexible circuit substrate TF may be used to transmit input sensing signals, which are provided from the main circuit substrate MF, to the input sensing unit TU.

Referring to FIG. 5A, the input sensing unit TU may include a first sensing electrode TE1, a second sensing electrode TE2, a first signal line SL1, a second signal line SL2, and a sensing pad portion TDL including sensing pads T-PD.

The conductive layers TML1 and TML2 described with reference to FIG. 2B may constitute the first sensing electrode TE1, the second sensing electrode TE2, the first signal line SL1, the second signal line SL2, and the sensing pads T-PD.

The first sensing electrode TE1 may be extended in the second direction DR2. In an exemplary embodiment, a plurality of the first sensing electrodes TE1 may be arranged in the first direction DR1. The first sensing electrode TE1 may include a plurality of first sensing patterns SP1, which are arranged in the second direction DR2, and first conductive patterns BP1, which are disposed between the first sensing patterns SP1.

The second sensing electrode TE2 may be electrically disconnected from the first sensing electrode TEL The second sensing electrode TE2 may be extended in the first direction DR1. In an exemplary embodiment, a plurality of the second sensing electrodes TE2 may be arranged in the second direction DR2. The second sensing electrode TE2 may include a plurality of second sensing patterns SP2, which are arranged in the first direction DR1, and second conductive patterns BP2, which are disposed between the second sensing patterns SP2.

An input sensing unit TU may sense the external input TC (e.g., see FIG. 1A) by sensing a change in mutual capacitance between the first and second sensing electrodes TE1 and TE2, or by sensing a change in self capacitance of each of the first and second sensing electrodes TE1 and TE2. In an exemplary embodiment, the input sensing unit SU may sense the external input TC in various manners, and the inventive concepts are not limited to a particular method of sensing the external input TC.

The first signal line SL1 may be connected to the first sensing electrode TEL The first signal line SL1 may be provided in the peripheral region NAA and may not be recognized by a user. The second signal line SL2 may be connected to the second sensing electrode TE2. The second signal line SL2 may be provided in the peripheral region NAA and may not be recognized by a user.

In an exemplary embodiment, each the first sensing electrodes TE1 may be connected to two first signal lines. Opposite ends of each of the first sensing electrodes TE1 may be connected to two different lines of the first signal lines SL1 and may be connected to the sensing pads T-PD. Accordingly, even when the first sensing electrode TE1 is longer than the second sensing electrode TE2, it may be possible to uniformly apply electrical signals to the entire region. As such, regardless of the shape of the input sensing unit SU, the input sensing unit SU may provide a uniform touch sensing environment throughout the active region AA.

However, the inventive concepts are not limited thereto. For example, in some exemplary embodiments, the second sensing electrode TE2 may be connected to two second signal lines, and each of the first and second sensing electrodes TE1 and TE2 may be connected to only one of the signal lines. In an exemplary embodiment, the input sensing unit SU may be operated in various manners.

The sensing pad portion TDL may be a portion to which the second flexible circuit substrate TF is coupled, and the sensing pads T-PD of the sensing pad portion TDL may be connected to pads, which are included in the second flexible circuit substrate TF. Accordingly, the input sensing unit TU and the main circuit substrate MF may be connected to each other through the second flexible circuit substrate TF.

FIG. 5B illustrates the sensing electrodes TE1 and TE2 of the input sensing unit TU and the display regions PXA-R, PXA-G, and PXA-B of the display unit DU, which are provided in the active region AA, and the arrangement thereof. The light-emitting region PXA described with reference to FIG. 4B may correspond to one of the light-emitting regions PXA-R, PXA-G, and PXA-B of FIG. 5B.

According to an exemplary embodiment, the input sensing unit TU may include a plurality of mesh lines MSL1 and MSL2, which are extended in a fourth direction DR4 and a fifth direction DR5. The mesh lines MSL1 and MSL2 may be overlapped with the non-light-emitting region NPXA, but may not be overlapped with the light-emitting regions PXA-R, PXA-G, and PXA-B. Accordingly, the display openings OP, which are defined in the pixel definition layer PDL, may be overlapped with corresponding mesh openings MSL-OP.

The mesh lines MSL1 and MSL2 may define a plurality of the mesh openings MSL-OP. Each of the mesh lines MSL1 and MSL2 may have a line width ranging from several micrometers to several nanometers. The mesh openings MSL-OP may correspond to the light-emitting regions PXA-R, PXA-G, and PXA-B in a one-to-one manner. FIG. 5B illustrates the light-emitting regions PXA-R, PXA-G, and PXA-B, which are classified into three groups, depending on their colors of light emitted therefrom.

The light-emitting regions PXA-R, PXA-G, and PXA-B may have different areas, depending on the color of light emitted from the emission layer EML of the organic light emitting device OLED. The areas of the light-emitting regions PXA-R, PXA-G, and PXA-B may be determined based on the kind of the organic light emitting device OLED.

The mesh openings MSL-OP may be classified into some groups having different areas. The mesh openings MSL-OP may be classified into three groups, depending on the corresponding types of the light-emitting regions PXA-R, PXA-G, and PXA-B.

Although the mesh openings MSL-OP are illustrated as corresponding to the light-emitting regions PXA-R, PXA-G, and PXA-B in a one-to-one manner, the inventive concepts are not limited thereto. For example, in some exemplary embodiments, each of the mesh openings MSL-OP may correspond to two or more regions of the light-emitting regions PXA-R, PXA-G, and PXA-B.

The light-emitting regions PXA-R, PXA-G, and PXA-B are illustrated as having various areas, but the inventive concepts are not limited thereto. For example, in some exemplary embodiments, the light-emitting regions PXA-R, PXA-G, and PXA-B may have the same size or area, and/or the mesh openings MSL-OP may also have the same size or area.

According to an exemplary embodiment, since the mesh lines MSL1 and MSL2 forming the sensing electrodes TE1 and TE2 are not overlapped with the light-emitting regions PXA-R, PXA-G, and PXA-B, light emitted from the pixel PX may not be affected by the mesh lines MSL1 and MSL2. Accordingly, it may be possible to provide the electronic device ED with improved color purity.

Figure 6A:
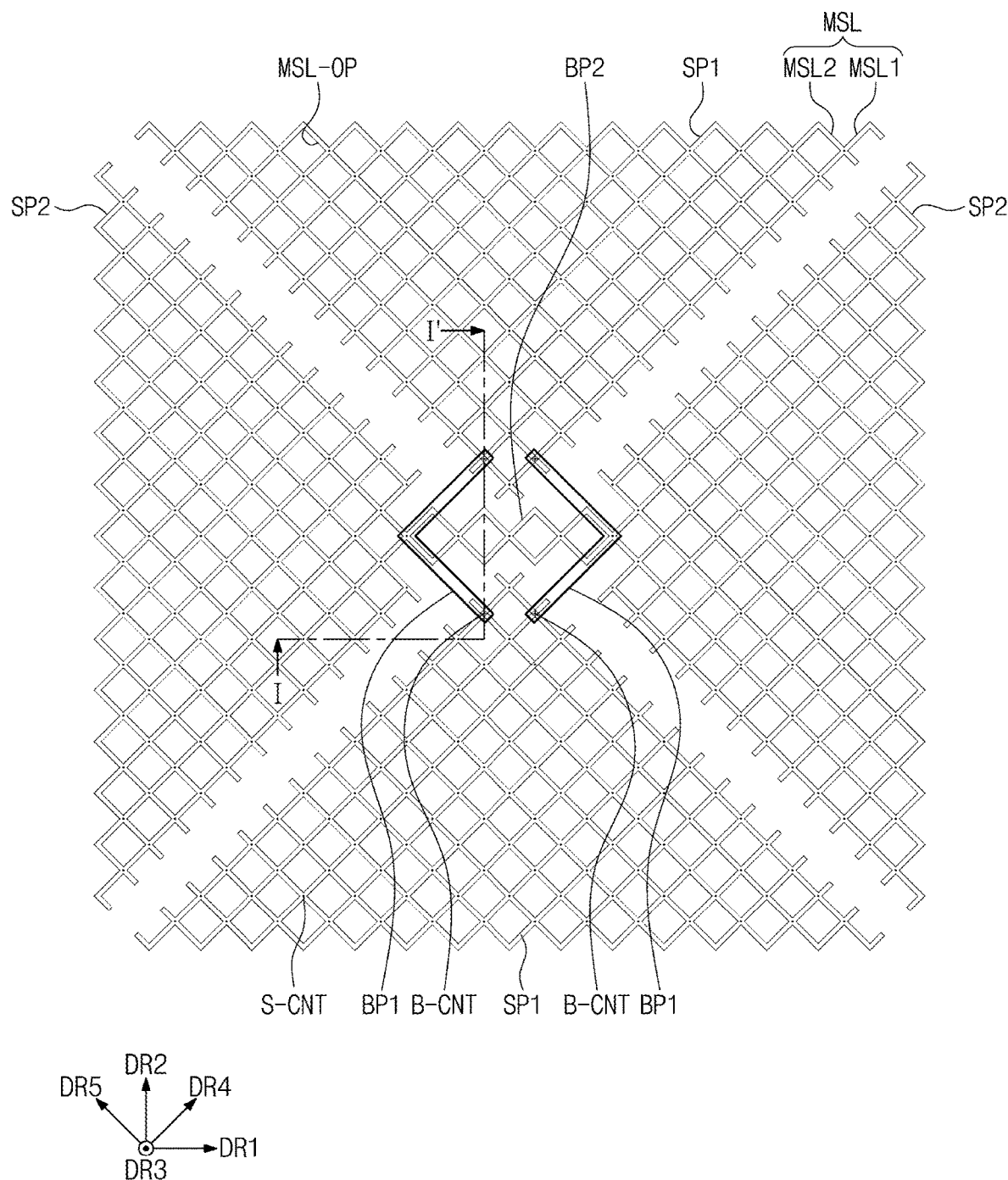
FIG. 6A is an enlarged view illustrating a region of an input sensing unit according to exemplary an embodiment of the invention.
Figure 6B:
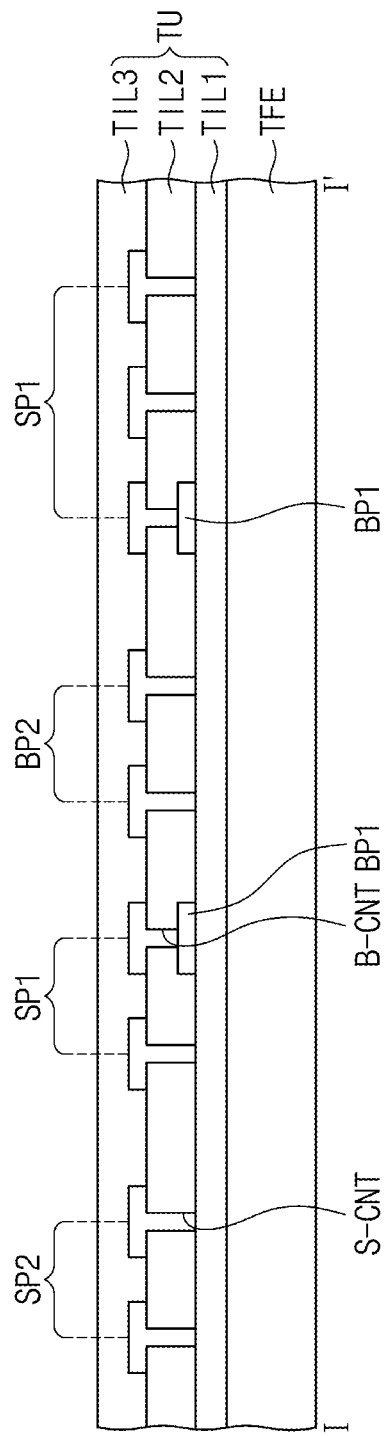
FIG. 6B is a cross-sectional view taken along line I-I' of FIG. 6A.

FIG. 6A is an enlarged view illustrating a region of an input sensing unit according to an exemplary embodiment. FIG. 6B is a cross-sectional view taken along line I-I' of FIG. 6A. For concise description, an element previously described with reference to FIGS. 1A to 5B may be identified by the same reference number, and thus, repeated descriptions of substantially the same elements will be omitted.

FIG. 6A illustrates a portion of each of the first sensing patterns SP1, the first conductive pattern BP1, the second sensing patterns SP2, and the second conductive pattern BP2, which form one of the sensing electrodes TE1 and TE2 (e.g., see FIG. 5A), in an enlarged manner.

In an exemplary embodiment, the second insulating layer TIL2 may include a plurality of contact holes B-CNT and S-CNT. The first contact holes B-CNT may be overlapped with some of the first sensing patterns SP1 and the first conductive pattern BP1, and the second contact holes S-CNT may be overlapped with the remaining ones of the first sensing patterns SP1, the second sensing patterns SP2, and the second conductive pattern BP2.

The first conductive pattern BP1 may be disposed on the first insulating layer TIL1, which is disposed on the encapsulation layer TFE. Some of the first sensing patterns SP1 may be coupled to the first conductive patterns BP1 through the first contact holes B-CNT defined in the second insulating layer TIL2.

At least one of the remaining ones of the first sensing patterns SP1, the second sensing patterns SP2, and the second conductive pattern BP2 may be in contact with the first insulating layer TIL1 through the second contact hole S-CNT.

The first contact holes B-CNT and the second contact holes S-CNT may be overlapped with the mesh lines MSL. Each of the second contact holes S-CNT may be disposed to be overlapped with an intersection of a first mesh line MLS1 and a second mesh line MLS2.

The first contact holes B-CNT and the second contact holes S-CNT may be formed by the same process. For example, the first contact holes B-CNT and the second contact holes S-CNT may be formed using the same mask in a process of removing the second insulating layer TIL2. As such, the first contact holes B-CNT and the second contact holes S-CNT may have the same arrangement and shape.

According to an exemplary embodiment, since the second insulating layer TIL2 includes the second contact holes S-CNT, which have the same arrangement and shape as those of the first contact holes B-CNT that are used to couple the first sensing patterns SP1 to the first conductive pattern BP1, it may be possible to prevent the first contact holes B-CNT from being recognized by a user. Accordingly, it may be possible to provide an electronic device with improved visibility.

Figure 7A:
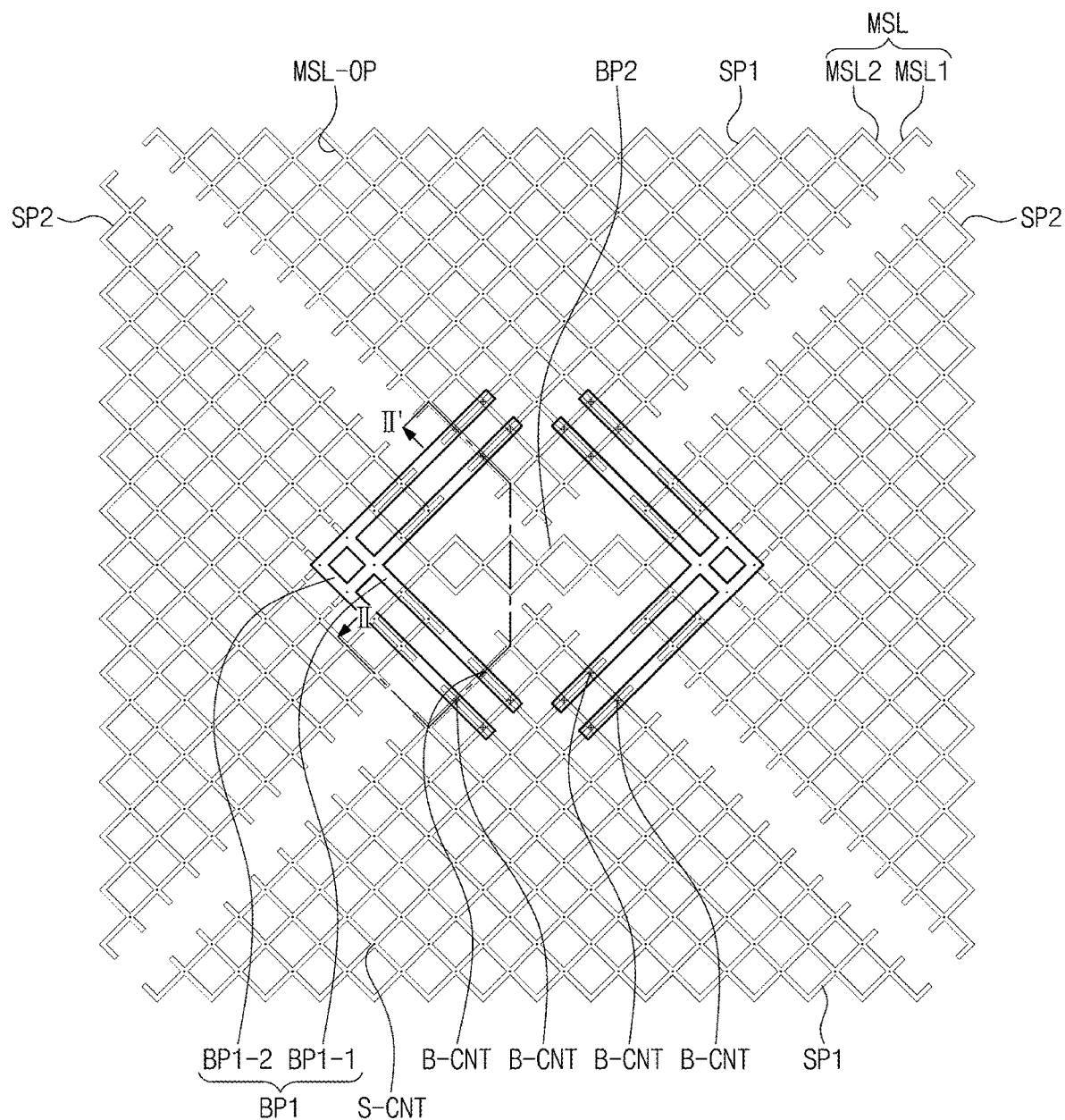
FIG. 7A is an enlarged view illustrating a region of an input sensing unit according to an exemplary embodiment of the invention.
Figure 7B:
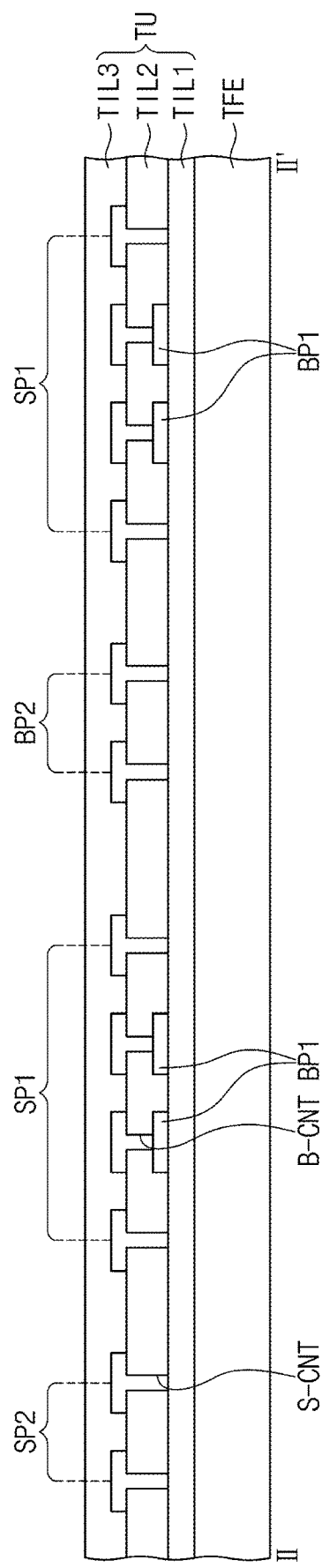
FIG. 7B is a cross-sectional view taken along line II-II' of FIG. 7A.

FIG. 7A is an enlarged view illustrating a region of an input sensing unit according to an exemplary embodiment. FIG. 7B is a cross-sectional view taken along line II-II' of FIG. 7A. For concise description, an element previously described with reference to FIGS. 1A to 6B may be identified by the same reference number, and thus, repeated descriptions of substantially the same elements will be omitted.

Referring to FIGS. 7A and 7B, the first sensing patterns SP1 according to the illustrated exemplary embodiment may be disposed between the first conductive patterns BP1, which are extended in the fourth and fifth directions DR4 and DR5.

The first conductive pattern BP1 may include a first sub-pattern BP1-1 and a second sub-pattern BP1-2. The first sub-pattern BP1-1 and the second sub-pattern BP1-2 may be disposed on the first insulating layer TIL1.

Each of the first and second sub-patterns BP1-1 and BP1-2 may include the mesh lines MSL or a transparent pattern.

The first conductive pattern BP1 and the second conductive pattern BP2 may be disposed on layers different from each other. In the illustrated exemplary embodiment, the first conductive pattern BP1 may be disposed on a layer different from a layer on which the first sensing patterns SP1, the second sensing patterns SP2, and the second conductive pattern BP2 are disposed. For example, the first sensing patterns SP1, the second sensing patterns SP2, and the second conductive pattern BP2 may be disposed on the second insulating layer TIL2.

Some of the first sensing patterns SP1 may be coupled to the first sub-pattern BP1-1 through the first contact hole B-CNT. The second sub-pattern BP1-2 may also be coupled to the first sensing patterns SP1 through the first contact hole B-CNT.

At least one of the remaining ones of the first sensing patterns SP1, the second sensing patterns SP2, and the second conductive pattern BP2 may be in contact with the first insulating layer TIL1 through the second contact hole S-CNT.

The first contact holes B-CNT and the second contact holes S-CNT may be overlapped with mesh lines MSLL. Each of the second contact holes S-CNT may be disposed to be overlapped with an intersection of the first and second mesh lines MLS1 and MLS2.

In the illustrated exemplary embodiment, a portion of the second sensing patterns SP2, which is overlapped with the first conductive pattern BP1, may be removed. Accordingly, it may be possible to prevent a parasitic capacitor, which may be formed between the second sensing patterns SP2 and the first conductive pattern BP1, to prevent a short circuit issue from occurring in a fabrication process. In this manner, the reliability of the electronic panel may be improved.

Figure 8A:
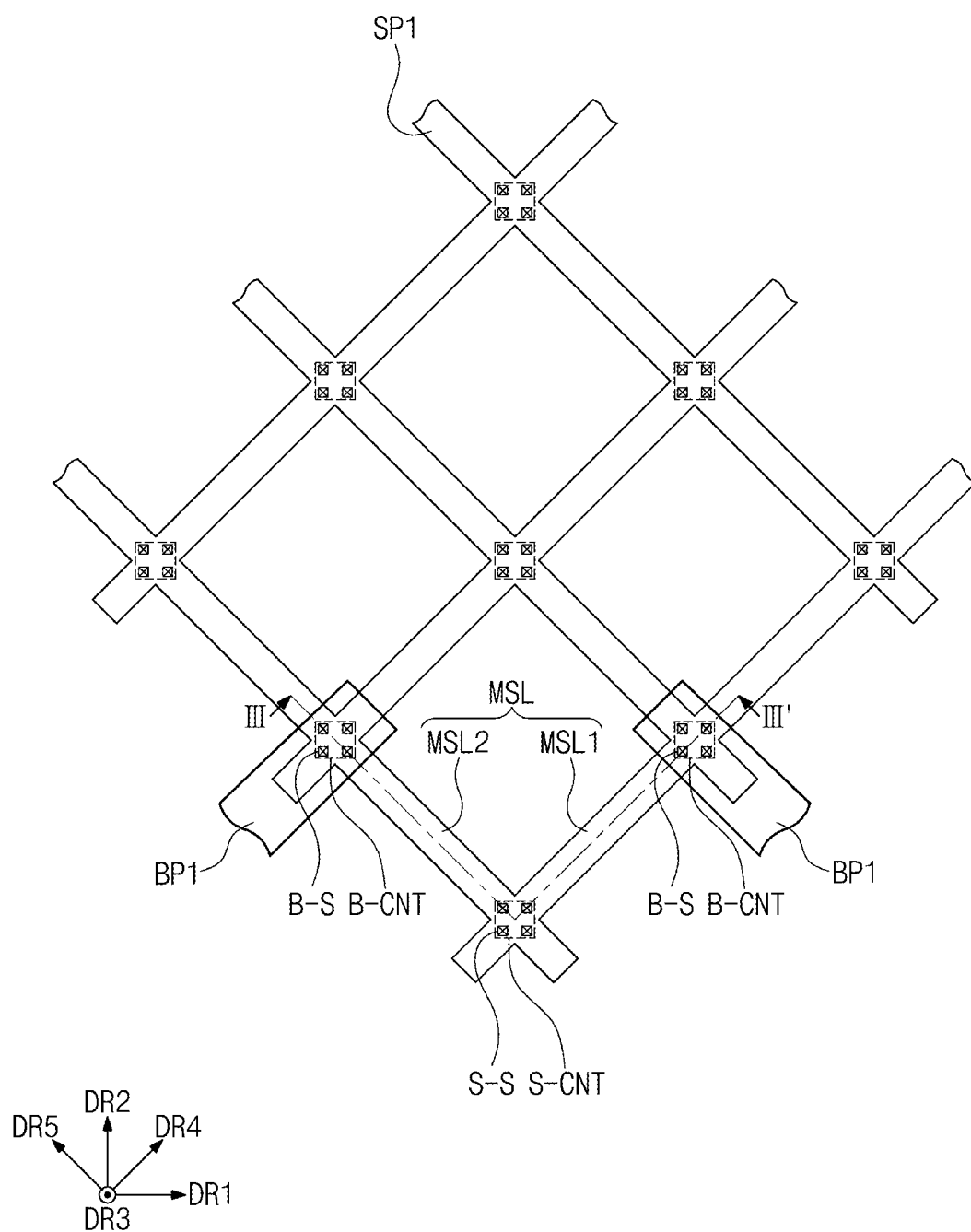
FIG. 8A is an enlarged view illustrating a region of an input sensing unit according to an exemplary embodiment of the invention.
Figure 8B:
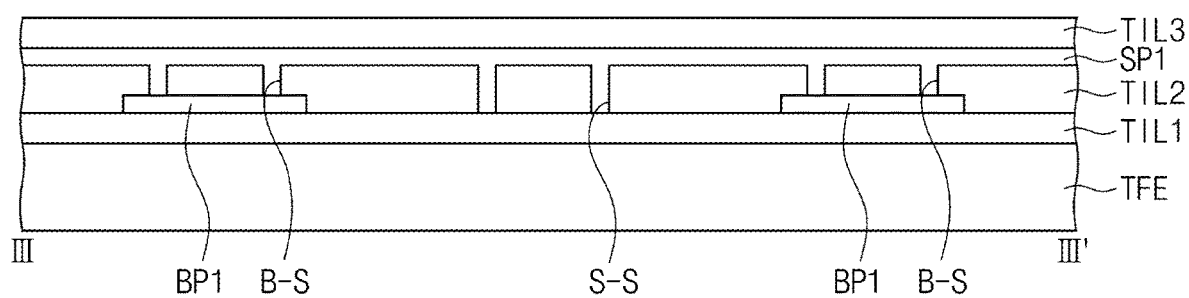
FIG. 8B is a cross-sectional view taken along line III-III' of FIG. 8A.

FIG. 8A is an enlarged view illustrating a region of an input sensing unit according to an exemplary embodiment. FIG. 8B is a cross-sectional view taken along line III-III' of FIG. 8A. For concise description, an element previously described with reference to FIGS. 1A to 6B may be identified by the same reference number, and thus, repeated descriptions of substantially the same elements will be omitted FIG. 8A illustrates some (e.g., the first sensing pattern SP1, the first conductive pattern BP1, the first contact holes B-CNT connecting the first sensing pattern SP1 to the first conductive pattern BP1, and the second contact holes S-CNT) of the input sensing unit TU (e.g., see FIG. 6A) in a simplified manner.

Referring to FIGS. 8A and 8B, each of the first contact holes B-CNT according to the illustrated exemplary embodiment may include a plurality of connection contact holes S-S. FIG. 8A exemplary illustrates the first contact hole B-CNT including four connection contact holes S-S, however, the inventive concepts are not limited thereto. For example, in some exemplary embodiments, the first contact holes B-CNT may include two or more connection contact holes S-S.

The first sensing pattern SP1 may be coupled to the first conductive pattern BP1 through the connection contact holes S-S. In the illustrated exemplary embodiment, each of the first sensing patterns SP1 may be coupled to a corresponding one of the first conductive patterns BP1 by a plurality of the connection contact holes S-S. In this manner, even when one of the connection contact holes S-S cannot be used for the electric connection between the first sensing patterns SP1 and the first conductive patterns BP1, the first sensing patterns SP1 and the first conductive patterns BP1 may be coupled to each other through the remaining ones of the connection contact holes S-S. In addition, it may be possible to reduce a contact resistance as compared with when a single contact hole with a large area is used for the electric connection between the first sensing patterns SP1 and the first conductive patterns BP1. Accordingly, the input sensing unit TU with improved electric characteristics may be provided.

In the illustrated exemplary embodiment, each of the second contact holes S-CNT may include a plurality of sub-contact holes B-S.

The arrangement and shape of the sub-contact holes B-S may be the same as the connection contact holes S-S. The first sensing pattern SP1 may be in contact with the first insulating layer TIL1 through the sub-contact holes B-S. Each of the sub-contact holes B-S and the connection contact holes S-S may be overlapped with the mesh lines MSL.

Figure 9:
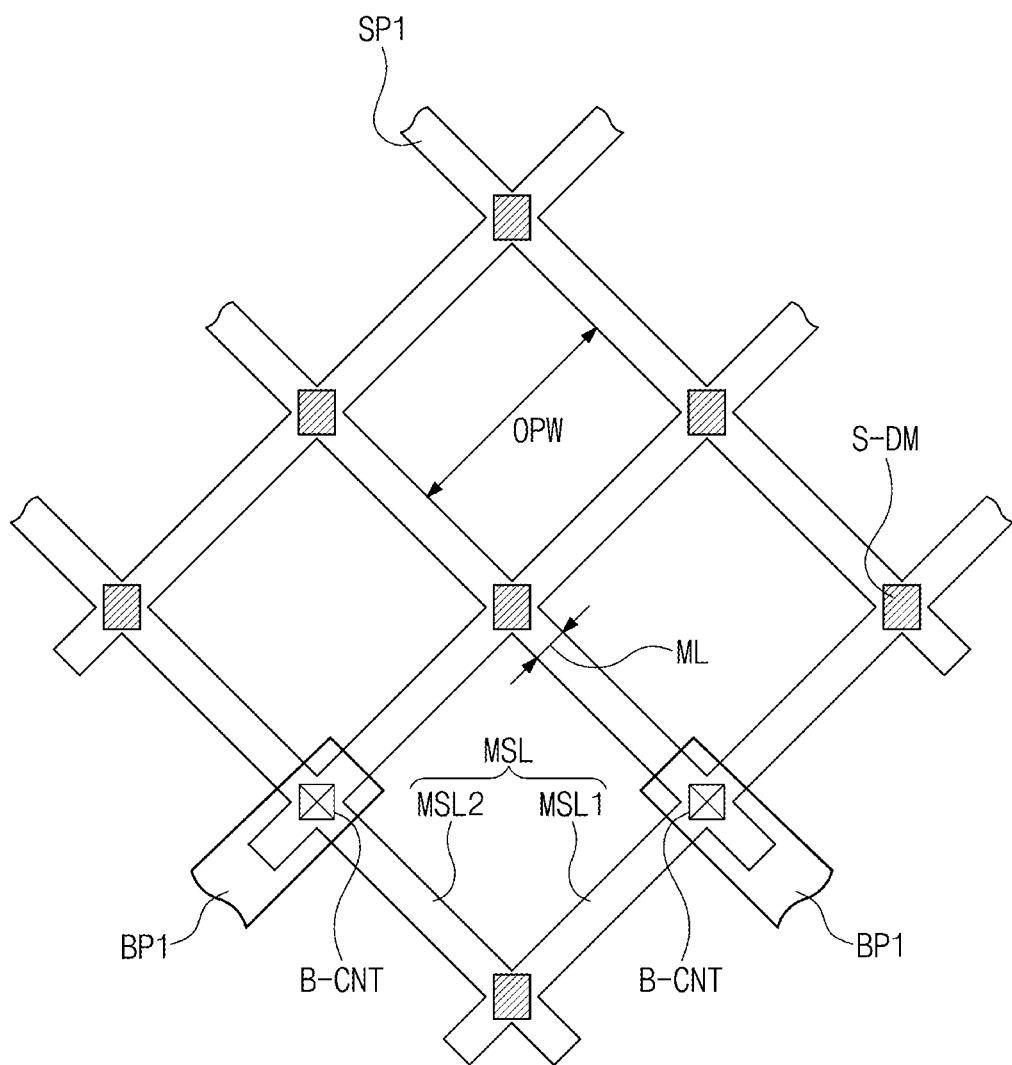
FIG. 9 is an enlarged view illustrating a region of an input sensing unit according to an exemplary embodiment of the invention.
Figure 10:
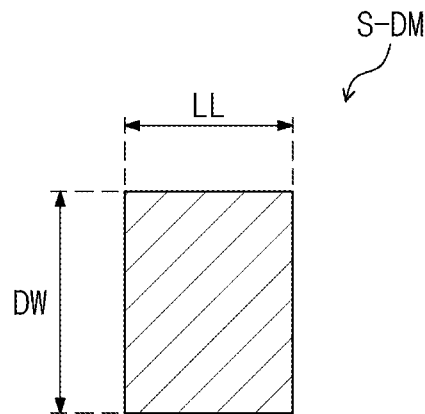
FIG. 10 is a plan view illustrating a reflection compensation pattern according to an exemplary embodiment of the invention.
Figure 10:
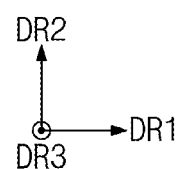
Figure 11:
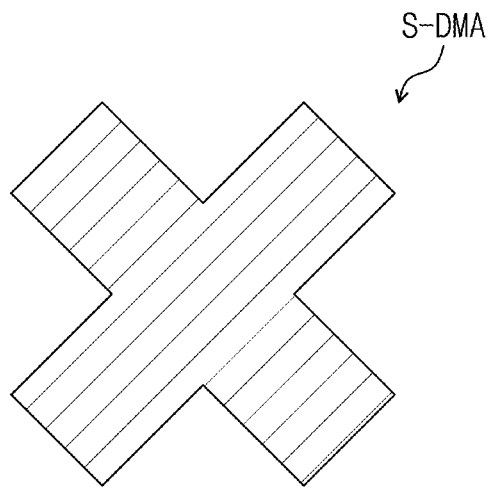
FIG. 11 is a plan view illustrating a reflection compensation pattern according to an exemplary embodiment of the invention.
Figure 11:
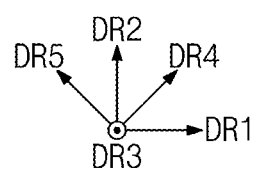

FIG. 9 is an enlarged view illustrating a region of an input sensing unit according to an exemplary embodiment. FIG. 10 is a plan view illustrating a reflection compensation pattern according to an exemplary embodiment. FIG. 11 is a plan view illustrating a reflection compensation pattern according to an exemplary embodiment. For concise description, an element previously described with reference to FIGS. 1A to 6B may be identified by the same reference number, and thus, repeated descriptions of substantially the same elements will be omitted.

FIG. 9 illustrates some (e.g., the first sensing pattern SP1, the first conductive pattern BP1, and the first contact holes B-CNT connecting the first sensing pattern SP1 to the first conductive pattern BP1) of the input sensing unit TU (e.g., see FIG. 6A) in a simplified manner.

Referring to FIG. 9, the input sensing unit according to the illustrated exemplary embodiment may further include a reflection compensation pattern S-DM overlapped with the mesh lines. The reflection compensation pattern S-DM may be spaced apart from the first contact holes B-CNT and may be disposed at an intersection of the mesh lines.

The reflection compensation pattern S-DM may be disposed on the first insulating layer TIL1 of FIG. 2B. When the first conductive pattern BP1 is disposed on the first insulating layer TIL1, the reflection compensation pattern S-DM may be spaced apart from the first conductive pattern BP1.

However, the inventive concepts are not limited thereto, and in some exemplary embodiments, the reflection compensation pattern S-DM may be disposed on the third insulating layer TIL3. In this case, the input sensing unit may further include an additional insulating layer covering the reflection compensation pattern S-DM.

Referring to FIG. 10, a length LL of the short side of the reflection compensation pattern S-DM parallel to the first direction DR1 may be equal to or less than the width ML (see FIG. 9) of the mesh line that is overlapped with the reflection compensation pattern S-DM.

In the illustrated exemplary embodiment, a length DW of the long side of the reflection compensation pattern S-DM parallel to the second direction DR2 may be equal to or less than half of a width OPW (see FIG. 9) of a single mesh opening. The reflection compensation pattern S-DM may be formed of or include the same material as the first conductive pattern BP1.

Referring to FIG. 11, the reflection compensation pattern S-DMA according to the illustrated exemplary embodiment may be an 'X'-shaped pattern, which has two portions extending in the fourth direction DR4 and the fifth direction DR5. The reflection compensation pattern S-DMA may be disposed at an intersection of the mesh lines.

However, the inventive concepts are not limited thereto, and in other exemplary embodiments, the shape and the number of the reflection compensation pattern may be varied, as long as the reflection compensation pattern is overlapped with the mesh lines and is spaced apart from the first contact holes B-CNT.

Figure 12:
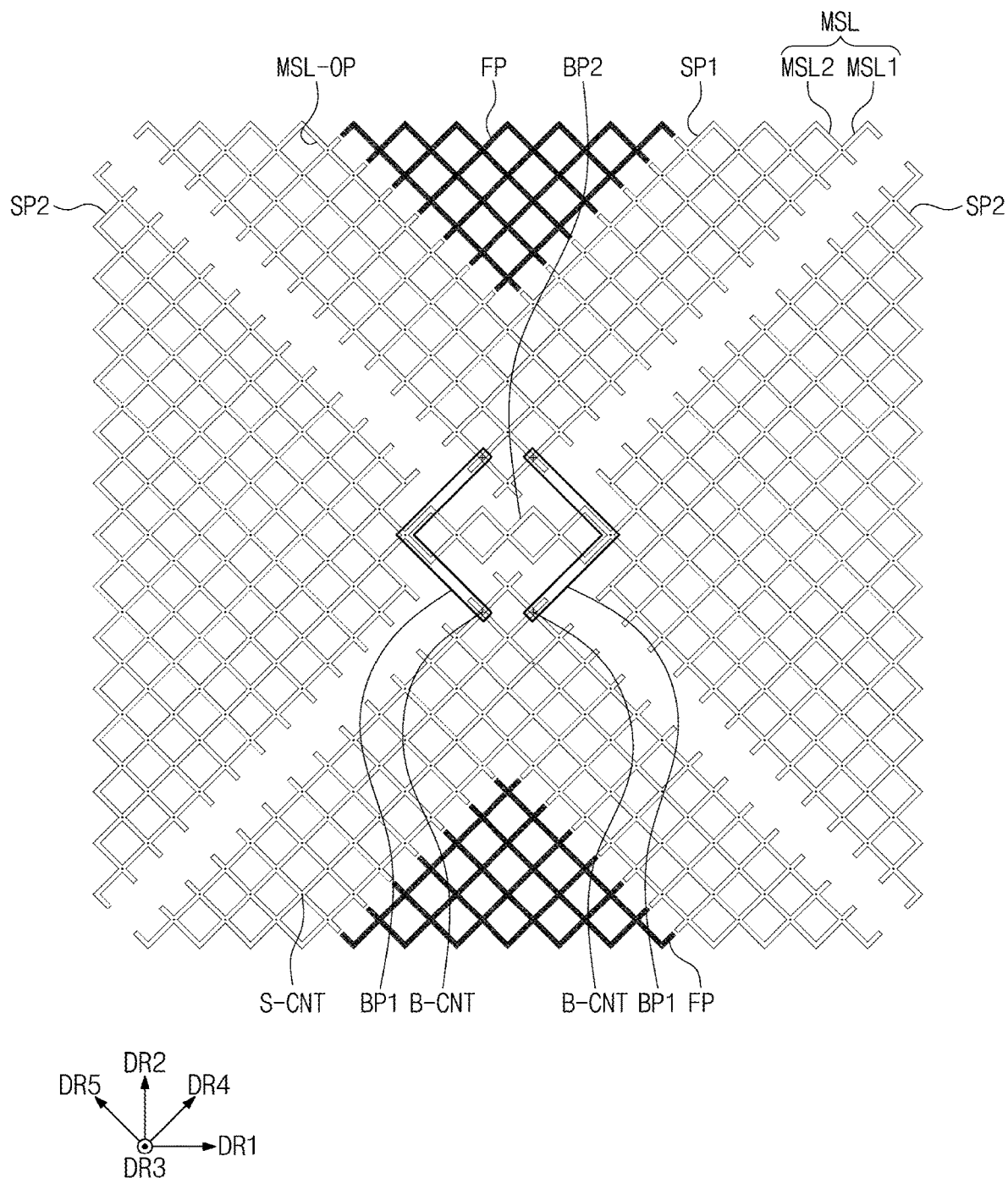
FIG. 12 is an enlarged view illustrating a region of an input sensing unit according to an exemplary embodiment of the invention.
Figure 13:
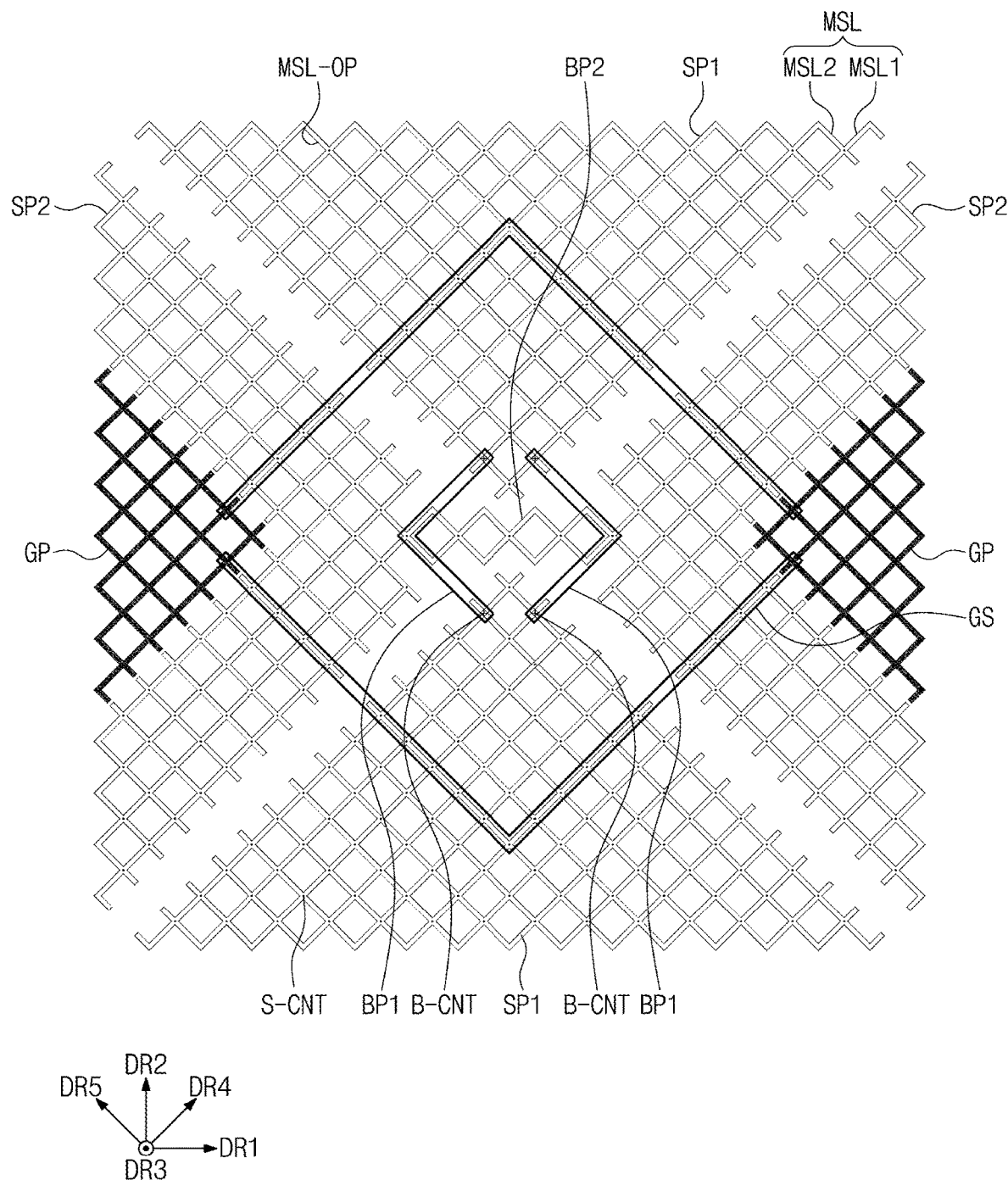
FIG. 13 is an enlarged view illustrating a region of an input sensing unit according to an exemplary embodiment of the invention.

FIG. 12 is an enlarged view illustrating a region of an input sensing unit according to an exemplary embodiment. FIG. 13 is an enlarged view illustrating a region of an input sensing unit according to an exemplary embodiment. For concise description, an element previously described with reference to FIGS. 1A to 6B may be identified by the same reference number, and thus, repeated descriptions of substantially the same elements will be omitted.

Referring to FIG. 12, the input sensing unit according to the illustrated exemplary embodiment may further include a floating pattern FP. The floating pattern FP may be enclosed by the first sensing pattern SP1 and may be spaced apart from the first sensing pattern SP1. The floating pattern FP and the first sensing pattern SP1 may be disposed on the same layer. The floating pattern FP may be disposed in and electrically disconnected from the first sensing pattern SP1, and thus, it may be possible to reduce a parasitic capacitance between patterns applied with different signals.

Referring to FIG. 13, the input sensing unit according to the illustrated exemplary embodiment may further include ground patterns GP and a ground conductive pattern GS disposed between the ground patterns GP. Each of the ground patterns GP may be enclosed by a corresponding one of the second sensing patterns SP2 and may be spaced apart from the second sensing pattern SP2. The ground patterns GP and the second sensing pattern SP2 may be disposed on the same layer. The ground conductive pattern GS and the ground patterns GP may be disposed on different layers and may be coupled to each other through a contact hole.

The ground patterns GP may be connected to a portion of the sensing pad T-PD of the sensing pad portion TDL through a ground line. For example, the ground line may be extended to the peripheral region NAA of FIG. 5A and may be connected to the sensing pad T-PD. The ground patterns GP and the ground conductive pattern GS may form a path for discharging electrostatic charges supplied to the input sensing unit from the outside to the outside. As such, it may be possible to provide an electronic device with improved durability.

According to exemplary embodiments, an input sensing unit may include first contact holes, which are included in an insulating layer and are used to connect sensing patterns to conductive pattern, and second contact holes, which have the same arrangement and shape as the first contact holes. In this manner, the first contact holes may be prevented from being recognized by a user. Accordingly, it may be possible to provide an electronic device with improved visibility.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device, comprising:
   a display unit comprising light-emitting areas providing an image and non-light-emitting areas adjacent to the light-emitting areas; and
   an input sensing unit disposed on the display unit, the input sensing unit comprising:
   a first insulating layer disposed on the display unit;
   a first conductive layer disposed on the first insulating layer and including first conductive patterns;
   a second insulating layer comprising first contact holes exposing the first conductive patterns and second contact holes exposing the first insulating layer overlapping each other, and disposed on the first insulating layer and covering the first conductive layer; and
   a second conductive layer formed of mesh lines that cross each other and define mesh openings overlapping the corresponding light-emitting areas,
   wherein each of the first contact holes and the second contact holes overlaps intersection portions of the mesh lines.

2. The electronic device of claim 1, wherein the number of the second contact holes is greater than the number of the first contact holes.

3. The electronic device of claim 1, wherein the second conductive layer comprises:
   first sensing patterns arranged in a first direction and connected to the first conductive patterns;
   second sensing patterns insulated from the first sensing patterns and arranged along a second direction crossing the first direction; and
   second conductive patterns disposed between adjacent second sensing patterns along the second direction.

4. The electronic device of claim 3, wherein the first sensing patterns are connected to the corresponding first conductive patterns through corresponding the first contact holes.

5. The electronic device of claim 4, wherein the second sensing patterns directly contact the first insulating layer through corresponding the second contact holes.

6. The electronic device of claim 3, wherein the input sensing unit further comprises:
   ground patterns respectively enclosed by the second sensing patterns and are spaced apart from the second sensing patterns; and
   ground conductive patterns disposed between adjacent the ground patterns.

7. The electronic device of claim 6, wherein the ground conductive patterns are disposed on the first insulating layer and spaced apart from the first conductive pattern.

8. The electronic device of claim 3, wherein the input sensing unit further comprises floating patterns respectively enclosed by the first sensing patterns and are spaced apart from the first sensing patterns.

9. The electronic device of claim 1, wherein the display unit comprises:
   a circuit device layer including a plurality of transistors;
   a display device layer including a pixel definition layer including display openings overlapping corresponding the light-emitting areas, first electrodes respectively exposed by the display openings, a second electrode opposite to the first electrodes, and emission layers disposed between the first electrodes and the second electrode; and
   an encapsulation layer including a first thin inorganic layer covering the display device layer, a thin organic layer disposed on the first thin inorganic layer, and a second thin inorganic layer disposed on the thin organic layer, and
   wherein each of the emission layers overlaps a corresponding one of the mesh openings.

10. The electronic device of claim 9, wherein the first insulating layer is directly disposed on the second thin inorganic layer.

11. An electronic device, comprising:
    a display unit comprising light-emitting areas providing an image and non-light-emitting areas adjacent to the light-emitting areas; and an input sensing unit disposed on the display unit, the input sensing unit comprising:

a first insulating layer disposed on the display unit;

a first conductive layer disposed on the first insulating layer and including first conductive patterns;

a second insulating layer comprising contact holes exposing the first conductive patterns, and disposed on the first insulating layer and covering the first conductive layer;

a second conductive layer formed of mesh lines that cross each other and define mesh openings overlapping the corresponding light-emitting areas; and reflection compensation patterns disposed on at least one of the first conductive layer and the second insulating layer, wherein each of the contact holes and the reflection compensation patterns overlaps intersection portions of the mesh lines.

12. The input sensing unit of claim 11, wherein the reflection compensation patterns have at least one of an 'X' shape or a rectangular shape, on a plane.

13. The electronic device of claim 11, wherein the second conductive layer comprises:

first sensing patterns arranged in a first direction and connected to the first conductive patterns;

second sensing patterns insulated from the first sensing patterns and arranged along a second direction crossing the first direction; and second conductive patterns disposed between adjacent second sensing patterns along the second direction.

14. The electronic device of claim 13, wherein the first sensing patterns are connected to the corresponding first conductive patterns through corresponding the contact holes.

15. The electronic device of claim 11, wherein the contact holes and the reflection compensation patterns are arranged in a regular pattern, on a plane.

* * * * *